United States Patent
Choi et al.

(10) Patent No.: US 11,838,002 B2
(45) Date of Patent: *Dec. 5, 2023

(54) HIGH FREQUENCY MULTILAYER FILTER

(71) Applicant: AVX Corporation, Fountain Inn, SC (US)

(72) Inventors: Kwang Choi, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/460,729

(22) Filed: Aug. 30, 2021

(65) Prior Publication Data

US 2021/0391842 A1 Dec. 16, 2021

Related U.S. Application Data

(63) Continuation of application No. 16/718,250, filed on Dec. 18, 2019, now Pat. No. 11,114,993.

(Continued)

(51) Int. Cl.
  *H03H 7/01* (2006.01)
  *H03H 1/00* (2006.01)
  *H03H 3/00* (2006.01)

(52) U.S. Cl.
  CPC ............ *H03H 7/0115* (2013.01); *H03H 1/00* (2013.01); *H03H 3/00* (2013.01); *H03H 7/1725* (2013.01);

(Continued)

(58) Field of Classification Search
  CPC .. H03H 7/1758; H03H 7/1775; H03H 7/1791; H03H 2001/0085; H03H 7/1766

(Continued)

(56) References Cited

U.S. PATENT DOCUMENTS 5,357,227 A 10/1994 Tonegawa et al.
6,529,101 B2 3/2003 Tojyo et al.
(Continued)

FOREIGN PATENT DOCUMENTS

CN 1855613 A 11/2006
CN 102354777 A 2/2012
(Continued)

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.

(Continued)

*Primary Examiner* — Rakesh B Patel

(74) *Attorney, Agent, or Firm* — Dority & Manning, P.A.

(57) ABSTRACT

A high frequency multilayer filter may include a plurality of dielectric layers and a signal path having an input and an output. The multilayer filter may include an inductor including a conductive layer formed over a first dielectric layer. The inductor may be electrically connected at a first location with the signal path and electrically connected at a second location with at least one of the signal path or a ground. The multilayer filter may include a capacitor including a first electrode and a second electrode that is separated from the first electrode by a second dielectric layer. The multilayer filter has a characteristic frequency that is greater than about 6 GHz.

18 Claims, 31 Drawing Sheets

Related U.S. Application Data

(60) Provisional application No. 62/782,464, filed on Dec. 20, 2018.

(52) U.S. Cl.
CPC ........ *H03H 7/1766* (2013.01); *H03H 7/1775* (2013.01); *H03H 2001/0085* (2013.01)

(58) Field of Classification Search
USPC .................................................. 333/175, 185
See application file for complete search history.

(56) References Cited

U.S. PATENT DOCUMENTS

| | | |
|---|---|---|
| 6,556,416 B2 | 4/2003 | Kunihiro |
| 6,720,848 B2 | 4/2004 | Okamura et al. |
| 6,734,755 B2 | 5/2004 | Cites et al. |
| 6,771,148 B2 | 8/2004 | Okamura et al. |
| 6,791,435 B2 | 9/2004 | Shingaki et al. |
| 6,900,708 B2 | 5/2005 | White et al. |
| 6,958,667 B2 | 10/2005 | Mizoguchi et al. |
| 6,970,057 B2 | 11/2005 | Lin et al. |
| 7,068,124 B2 | 6/2006 | White et al. |
| 7,098,760 B2 | 8/2006 | Okamura et al. |
| 7,119,639 B2 | 10/2006 | Okamura et al. |
| 7,126,444 B2 | 10/2006 | Fukinaga et al. |
| 7,187,109 B2 | 3/2007 | Tikka et al. |
| 7,239,219 B2 | 7/2007 | Brown et al. |
| 7,239,221 B2 | 7/2007 | Okamura et al. |
| 7,245,194 B2 | 7/2007 | Muto |
| 7,268,648 B2 | 9/2007 | Okamura et al. |
| 7,312,676 B2 | 12/2007 | Kundu |
| 7,592,885 B2 | 9/2009 | Sekine et al. |
| 7,612,634 B2 | 11/2009 | Iwata |
| 7,652,554 B2 | 1/2010 | Moriai et al. |
| 7,907,034 B2 | 3/2011 | Taniguchi |
| 8,013,688 B2 | 9/2011 | White et al. |
| 8,067,723 B2 | 11/2011 | Yamada et al. |
| 8,106,722 B2 | 1/2012 | Shimamura et al. |
| 8,159,313 B2 | 4/2012 | Uchaykin |
| 8,179,210 B2 | 5/2012 | Feichtinger |
| 8,384,013 B2 | 2/2013 | Yamada et al. |
| 8,390,984 B2 | 3/2013 | Liu et al. |
| 8,405,468 B2 | 3/2013 | Uchaykin |
| 8,446,705 B2 | 5/2013 | Ritter et al. |
| 8,451,073 B2 | 5/2013 | Hoeft et al. |
| 8,659,871 B2 | 2/2014 | Togashi et al. |
| 8,754,726 B2 | 6/2014 | Sasaki et al. |
| 9,142,342 B2 | 9/2015 | Haner |
| 9,218,910 B2 | 12/2015 | Kim |
| 9,240,392 B2 | 1/2016 | Hurwitz et al. |
| 9,287,845 B2 | 3/2016 | Fukamachi et al. |
| 9,349,788 B2 | 5/2016 | Hurwitz et al. |
| 9,647,313 B2 | 5/2017 | Marconia et al. |
| 9,698,747 B2 | 7/2017 | Ishizuka |
| 9,935,603 B2 | 4/2018 | Imamura |
| 9,949,373 B2 | 4/2018 | Hurwitz et al. |
| 10,014,843 B2 | 7/2018 | Hurwitz et al. |
| 10,063,211 B2 | 8/2018 | Yahezkely et al. |
| 10,110,196 B2 | 10/2018 | Mukai |
| 10,218,330 B2 | 2/2019 | Park et al. |
| 10,236,854 B2 | 3/2019 | Hurwitz et al. |
| 10,236,856 B2 | 3/2019 | Kaminishi |
| 10,277,190 B2 | 4/2019 | Masuda et al. |
| 10,283,566 B2 | 5/2019 | Sel et al. |
| 10,389,329 B2 | 8/2019 | Shiokawa |
| 10,466,335 B2 | 10/2019 | Hurwitz et al. |
| 10,763,214 B2 | 9/2020 | Kariyazaki et al. |
| 10,944,375 B2 | 3/2021 | Imamura |
| 2006/0055489 A1 | 3/2006 | Okamuara et al. |
| 2007/0085108 A1 | 4/2007 | White et al. |
| 2008/0047743 A1 | 2/2008 | Komatsu et al. |
| 2008/0116998 A1* | 5/2008 | Sekine ................ H03H 7/0115 333/185 |
| 2009/0027141 A1 | 1/2009 | Oshima |
| 2009/0033439 A1 | 2/2009 | Igarashi |
| 2014/0153154 A1 | 6/2014 | Choi et al. |
| 2015/0296617 A1 | 10/2015 | Hurwitz et al. |
| 2016/0307702 A1 | 10/2016 | Tanaka et al. |
| 2017/0133997 A1 | 5/2017 | Imamura |
| 2020/0203075 A1 | 6/2020 | Choi et al. |
| 2020/0204137 A1 | 6/2020 | Choi et al. |
| 2020/0204138 A1 | 6/2020 | Choi et al. |
| 2020/0204142 A1 | 6/2020 | Choi et al. |
| 2020/0205285 A1 | 6/2020 | Choi et al. |

FOREIGN PATENT DOCUMENTS

| | | |
|---|---|---|
| EP | 2 068 393 A1 | 6/2009 |
| JP | H 05136644 A | 6/1993 |
| JP | 2002203720 A | 7/2002 |
| JP | 200017243 A | 1/2008 |
| JP | 2008004768 A | 1/2008 |
| JP | 2008042433 A | 2/2008 |
| JP | 2010114899 A | 5/2010 |
| JP | 2010147320 A | 7/2010 |
| JP | 4539422 B2 | 9/2010 |
| JP | 2010239250 A | 10/2010 |
| JP | 5152192 B2 | 2/2013 |
| JP | 2018067612 A | 4/2018 |
| KR | 20170004238 A | 1/2017 |
| TW | 548669 B | 8/2003 |
| WO | WO 2004/004061 | 1/2004 |

OTHER PUBLICATIONS

International Search Report and Written Opinion for PCT/US2019/067083 dated Apr. 13, 2020, 11 pages.

* cited by examiner

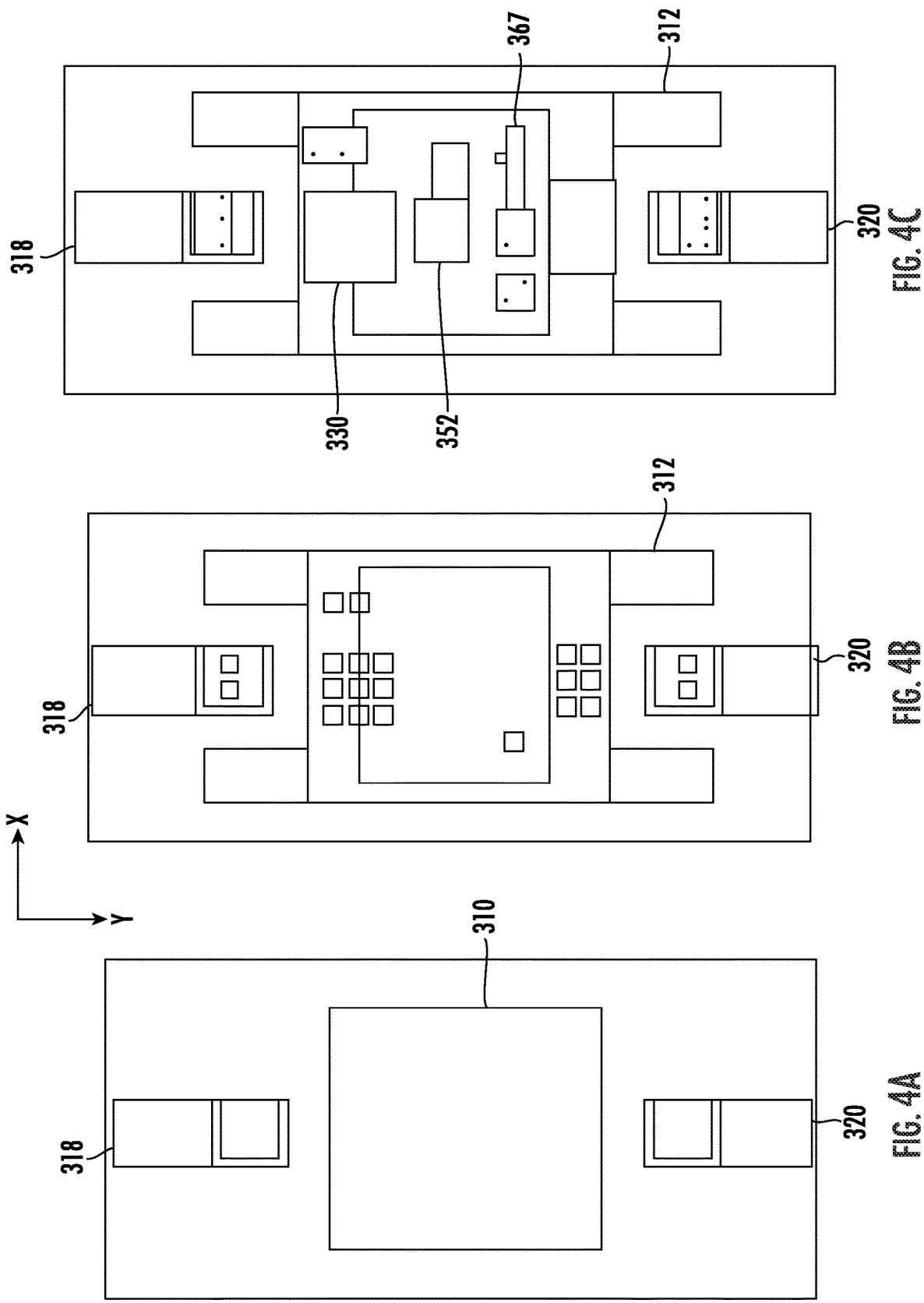

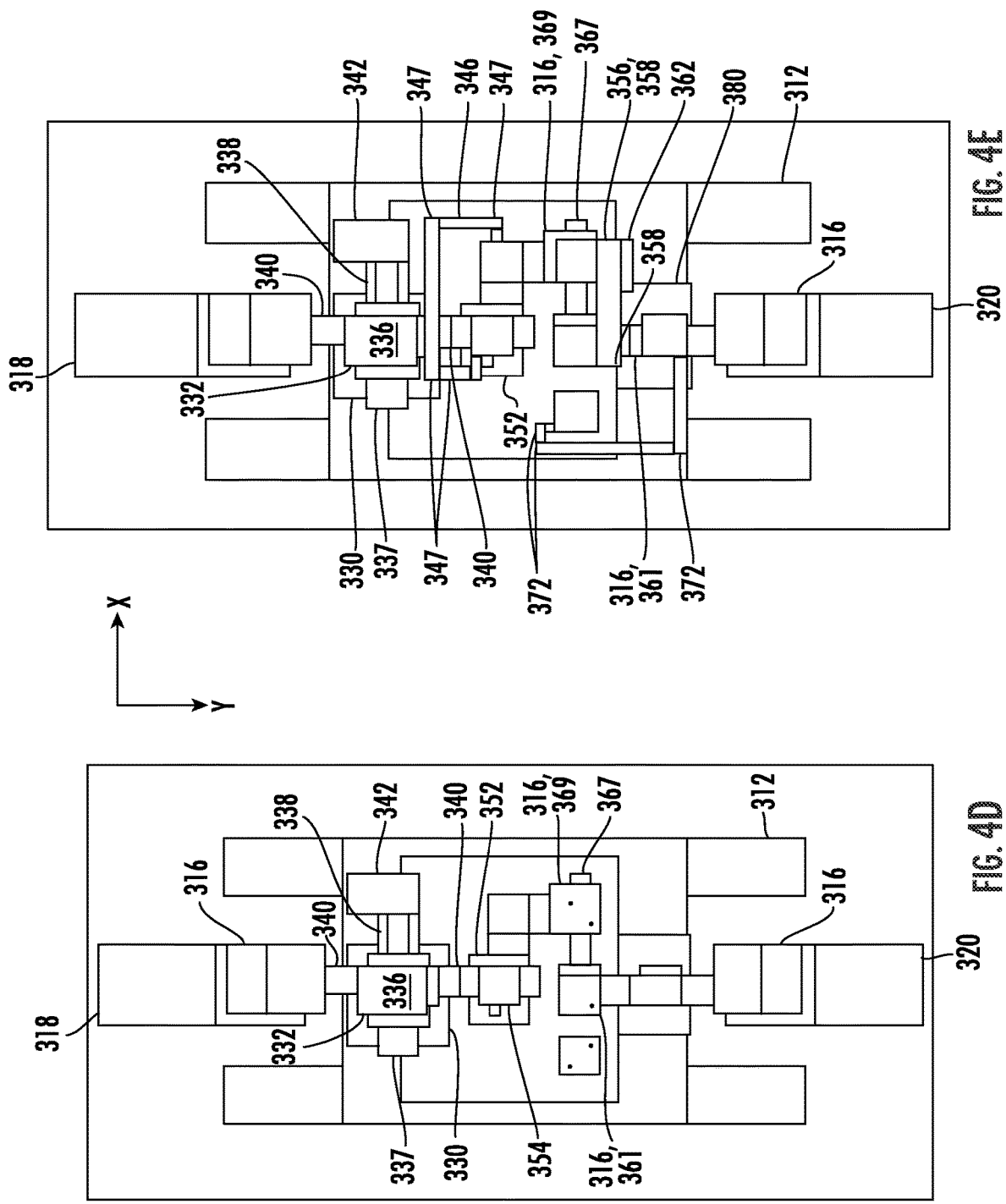

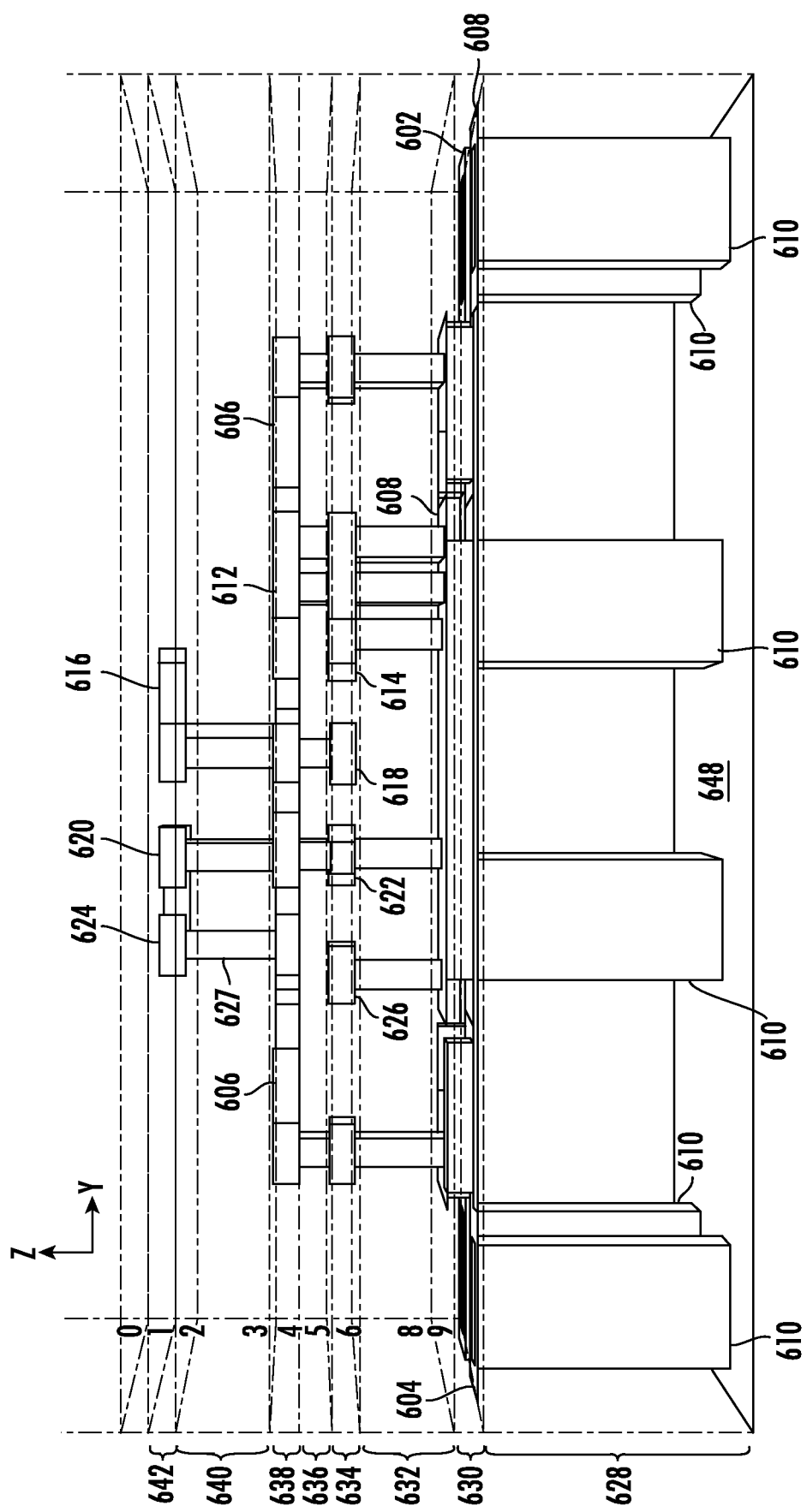

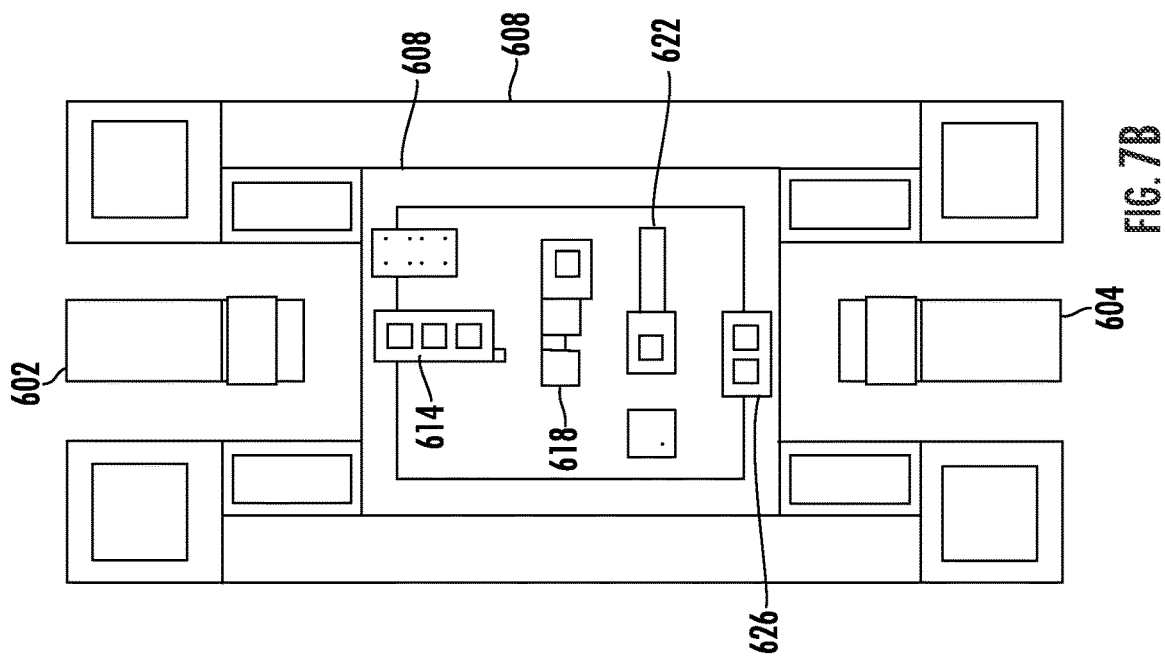
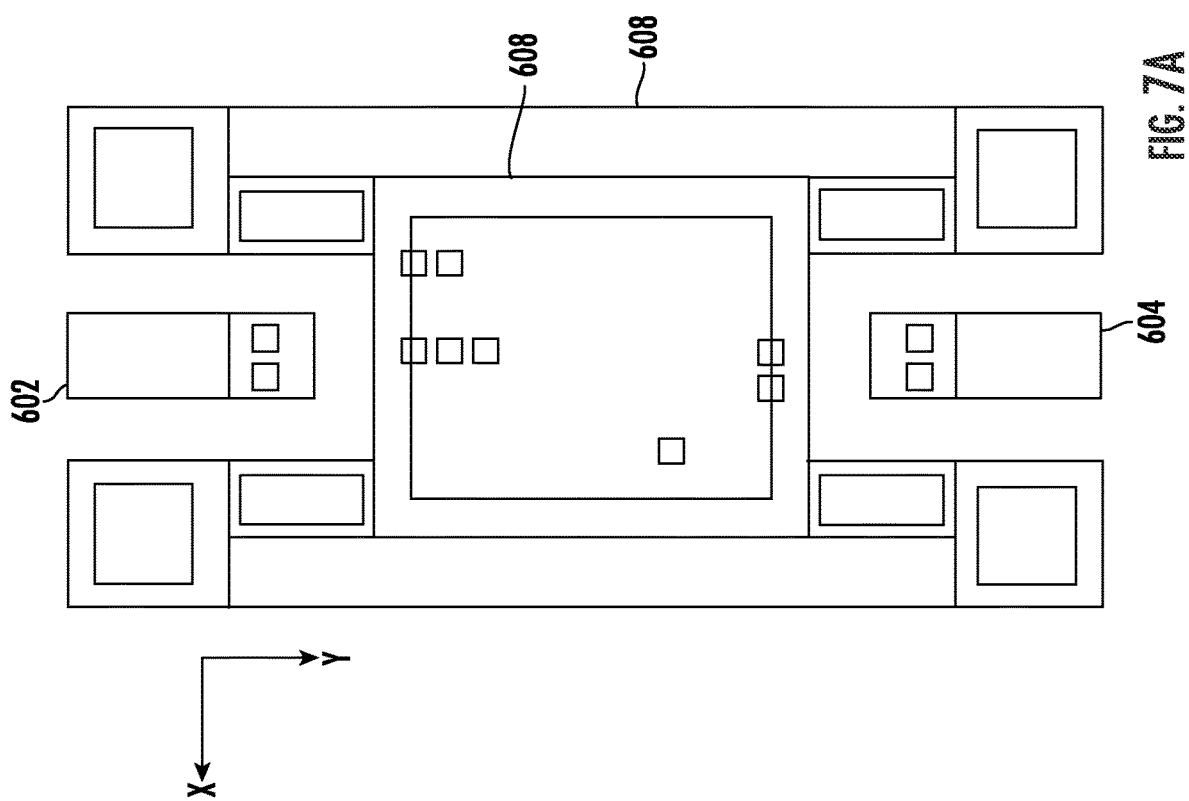

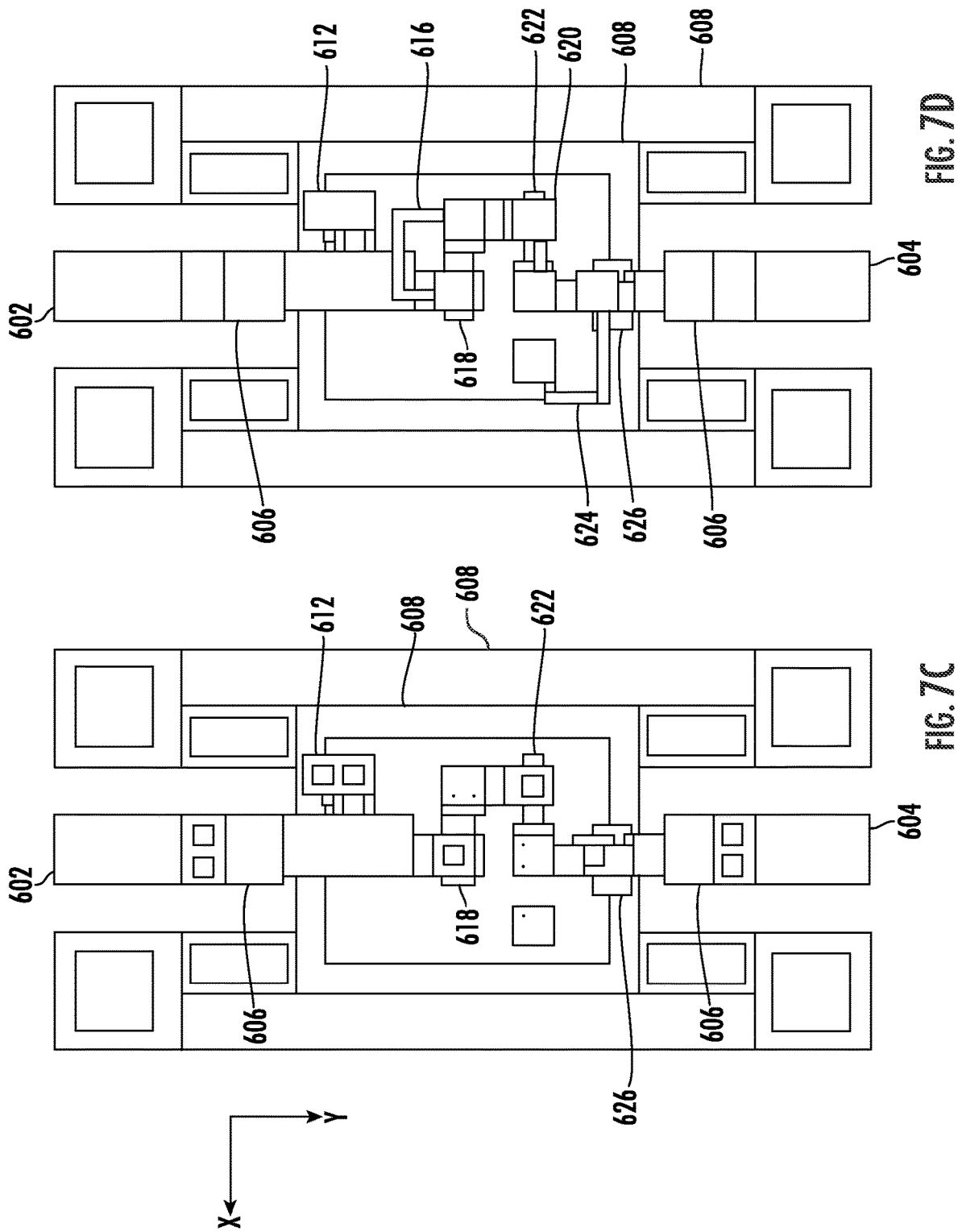

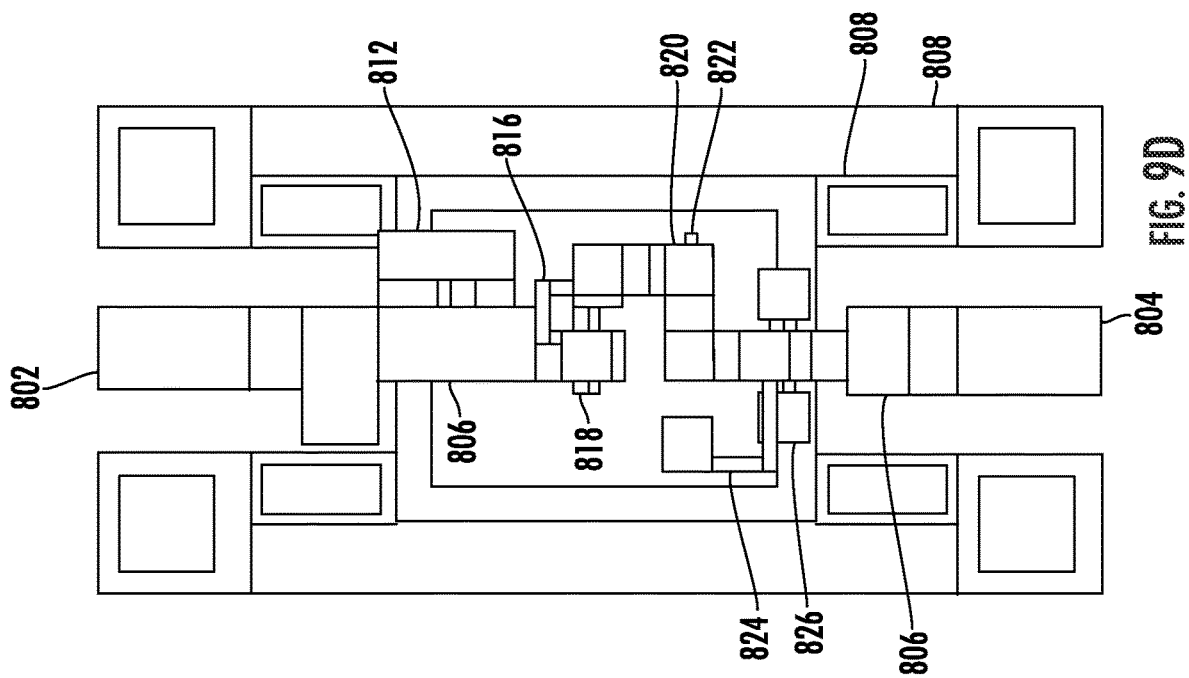
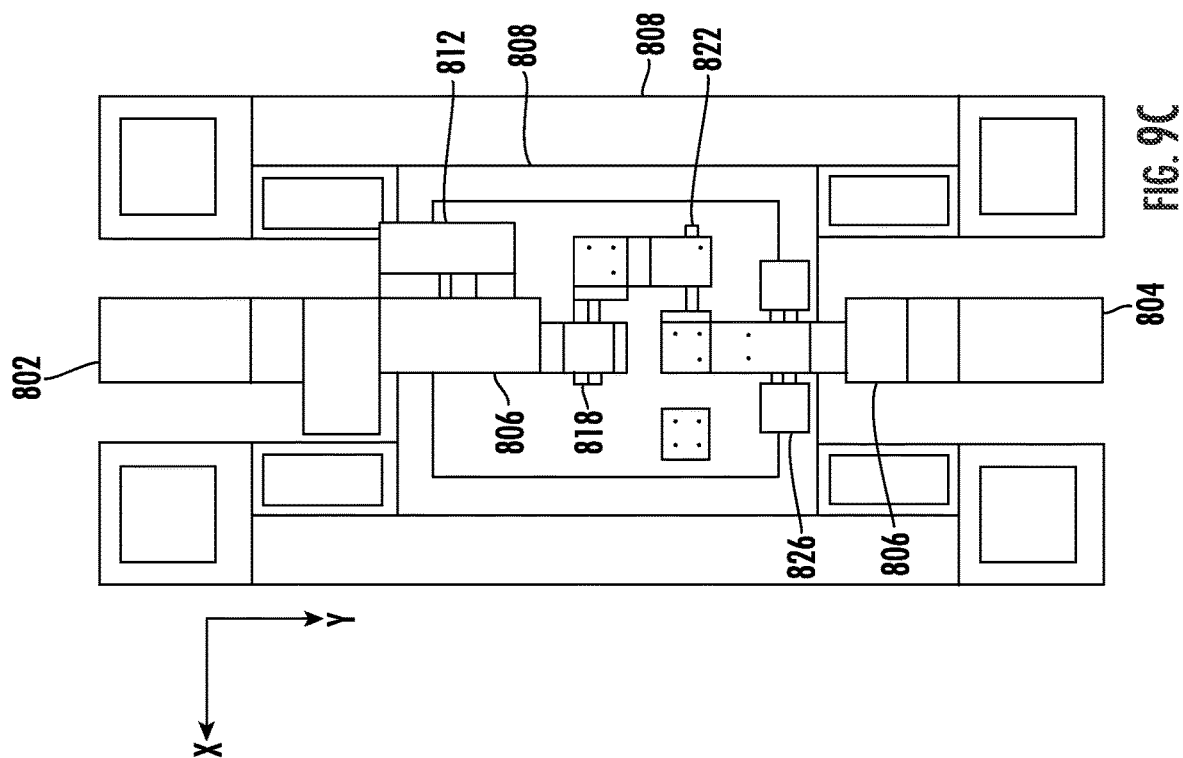

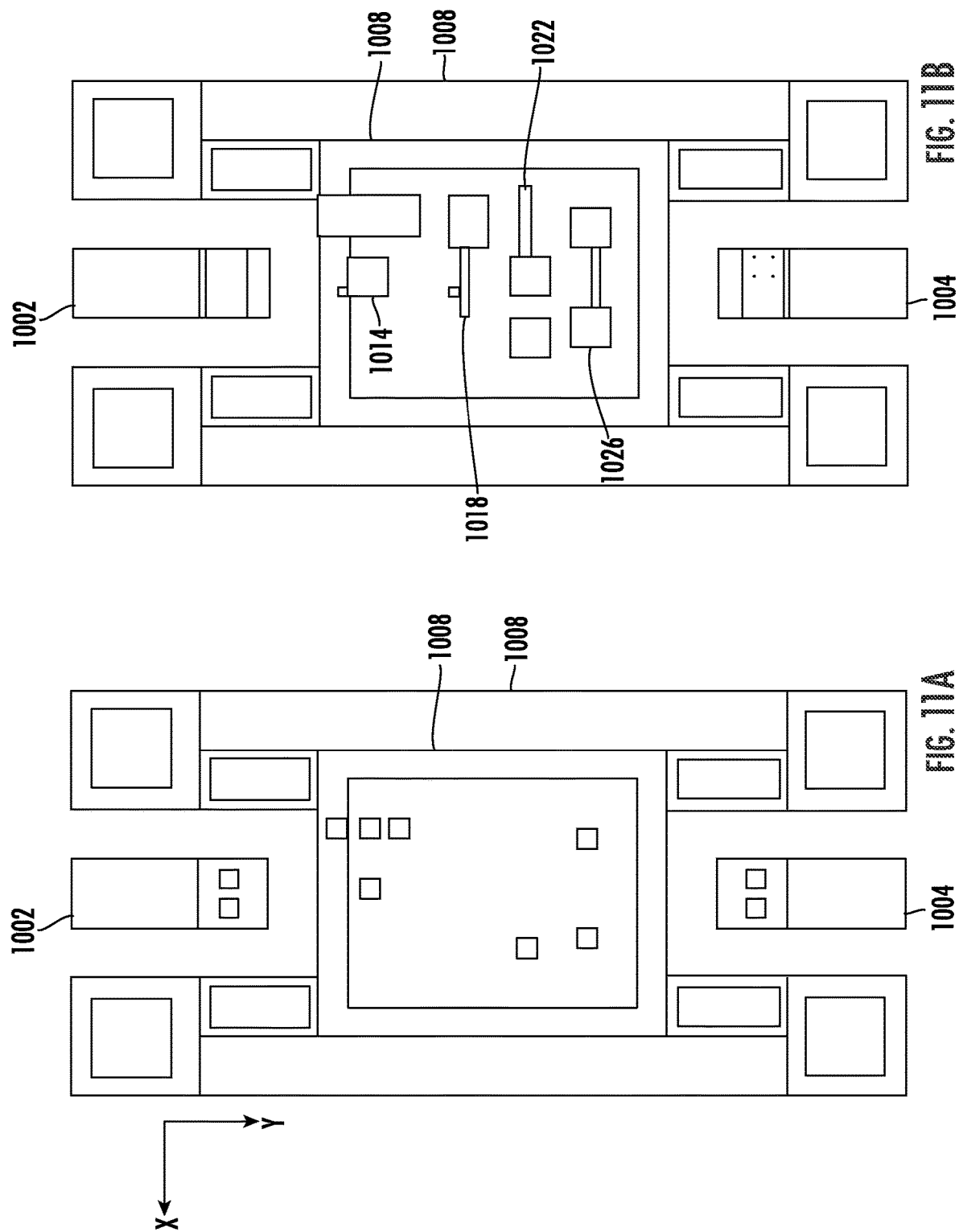

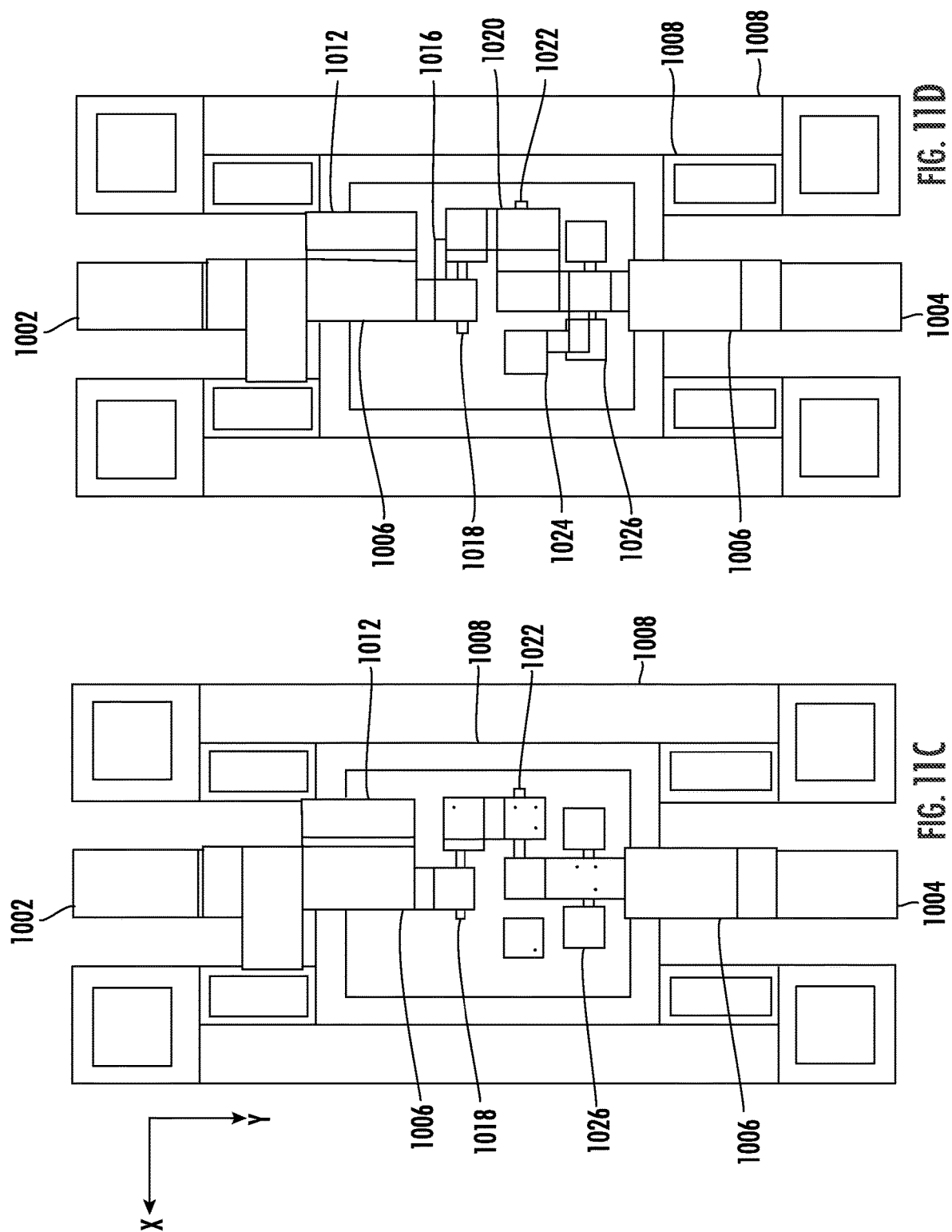

HIGH FREQUENCY MULTILAYER FILTER

CROSS REFERENCE TO RELATED APPLICATIONS

The present application is a continuation of U.S. application Ser. No. 16/718,250 having a filing date of Dec. 18, 2019, which claims filing benefit of U.S. Provisional Patent Application Ser. No. 62/782,464 having a filing date of Dec. 20, 2018, which are incorporated herein by reference in their entirety.

BACKGROUND OF THE DISCLOSURE

Electric filters perform many functions and are employed in a variety of electrical devices. Filtering of high frequency signals, such as high frequency radio signal communication, has recently increased in popularity. For example, the demand for increased data transmission speed for wireless connectivity has driven demand for high frequency components, including those configured to operate at high frequencies, including 5G spectrum frequencies. Current high frequency filters employ waveguide or cavity designs. The performance characteristics of such designs, however, are difficult to tailor or customize. As such, a high frequency multilayer filter would be welcomed in the art.

SUMMARY OF THE DISCLOSURE

In accordance with one embodiment of the present disclosure, a high frequency multilayer filter may include a plurality of dielectric layers and a signal path having an input and an output. The multilayer filter may include an inductor including a conductive layer formed over a first dielectric layer. The inductor may be electrically connected at a first location with the signal path and electrically connected at a second location with at least one of the signal path or a ground. The multilayer filter may include a capacitor including a first electrode and a second electrode that is separated from the first electrode by a second dielectric layer. The multilayer filter has a characteristic frequency that is greater than about 8 GHz.

In accordance with another embodiment of the present disclosure, a method of forming a high frequency multilayer filter may include forming an inductor including a conductive layer on a first dielectric layer and a capacitor including a first electrode and a second electrode that is separated from the first electrode by a second dielectric layer. The method may include forming a first via at a first location electrically connecting the inductor with a signal path and forming a second via at a second location electrically connecting the inductor with at least one of the signal path or a ground plane. The method may include stacking the first and second dielectric layers. The multilayer filter may have a characteristic frequency that is greater than about 8 GHz.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 4A through 4E are a series of sequential top down views of the filter in which an additional layer is shown in each sequential figure;

FIGS. 7A through 7D are a series of sequential top down views of the filter of FIGS. 6A and 6B in which an additional layer is shown in each sequential figure;

FIGS. 9A through 9D are a series of sequential top down views of the filter of FIGS. 8A and 8B in which an additional layer is shown in each sequential Figure;

FIGS. 11A through 11D are a series of sequential top down views of the filter of FIGS. 10A and 10B in which an additional layer is shown in each sequential figure;

Figure 1:
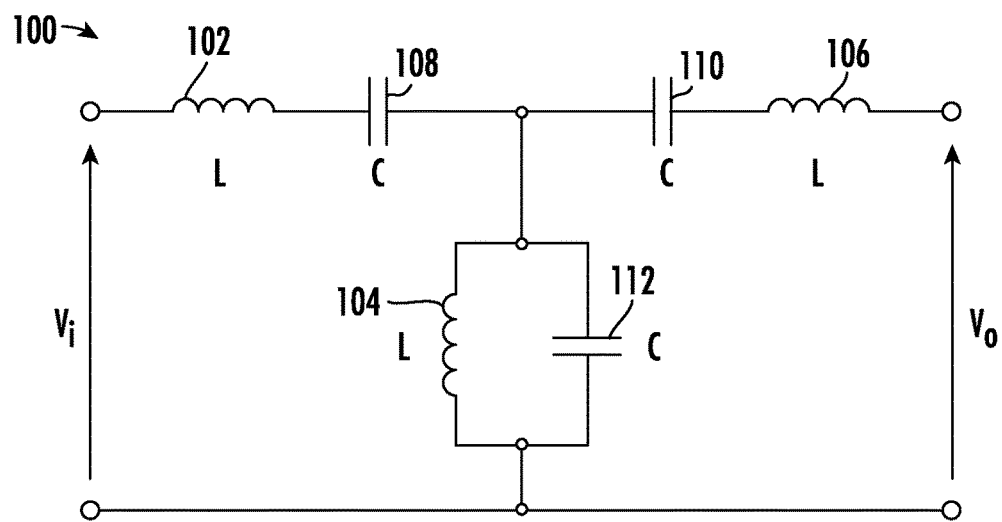
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a high frequency multilayer filter. The multilayer filter may include a signal path having an input and an output. The multilayer filter may be configured to filter signals from the input and produce a filtered output signal at the output. A plurality of dielectric layers may have conductive layers formed thereon that are selectively shaped or patterned to form capacitors and/or inductors.

The multilayer filter may include an inductor including a conductive layer formed over a first dielectric layer. The inductor may be electrically connected at a first location with the signal path and electrically connected at a second location with at least one of the signal path or a ground.

The multilayer filter may include a capacitor including a first electrode and a second electrode that is separated from the first electrode by a second dielectric layer, which is distinct from the first dielectric layer. In other words, the capacitor separated from the inductor by in a vertical, Z-direction (e.g., by one or more dielectric layers), for example by at least 10 microns, in some embodiments at least about 20 microns, in some embodiments at least about 30 microns, in some embodiments at least about 40 microns, in some embodiments at least about 50 microns, in some embodiments at least about 60 microns, in some embodiments at least about 80 microns, and in some embodiments at least about 150 microns.

The present inventors have discovered that such separation between the inductor and conductor electrodes reduces interference and produces excellent performance characteristics at high frequencies. In some embodiments, the multilayer filter may have a characteristic frequency that is greater than about 6 GHz. Example characteristic frequencies may include a low pass frequency, a high pass frequency, an upper bound of a bandpass frequency, or a lower bound of the bandpass frequency. Characteristics frequencies are generally defined at −3 dB rejection.

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation, and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other theremoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other theremoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetraflouroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semiconductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In such examples, the dielectric material may have a dielectric constant that is greater than 100, for example within a range from between about 100 to about 4000, in some embodiments from about 1000 to about 3000.

In some embodiments, the high frequency multilayer filter may include a signal path having an input and an output. The signal path may include one or more conductive layers formed over one or more of the dielectric layers. As used herein, a conductive layer "formed over" a dielectric layer may refer to a conductive layer formed directly on the dielectric layer. However, one or more thin intermediate layers or coating may be located between the conductive layer and/or dielectric layer.

The conductive layers may include a variety of conductive materials. For example, the conductive layers may include copper, nickel, gold, silver, or other metals or alloys.

The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to for form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

In some embodiments, the high frequency multilayer filter may include one or more vias formed in one or more of the dielectric layers. For example, a via may electrically connect a conductive layer on one dielectric layer with a conductive layer on another dielectric layer. The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper. The vias may be filled with conductive material such that a solid column of conductive material is formed. Alternatively, the interior surfaces of the through holes may be plated such that the vias are hollow.

Regardless of the particular configuration employed, the present inventors have discovered that through selective control over the arrangement of elements and selection of materials, a multilayer filter can be achieved that has a characteristic frequency greater than about 8 GHz. The high frequency multilayer filter may be configured to provide capacitors with very low capacitance and/or inductors with very low inductance such that the multilayer frequency provides excellent performance characteristics at high frequencies (e.g., greater than about 8 GHz). Without being bound by theory, the magnitude of capacitance and/or inductance that is appropriate for elements within a filter generally decreases as frequency increases. The present inventors have discovered that such low inductance and capacitance elements can be achieved through selective arrangement of components, selection of dimensions (e.g., thicknesses of dielectric layers), and/or selection of materials (e.g., dielectric materials). Additionally, parasitic inductance can be reduced to a satisfactory level using thin dielectric layers, which result in thin vertical structures (e.g., vias).

Examples of characteristic frequencies include a low pass frequency, a high pass frequency, an upper bound of a bandpass frequency, or a lower bound of the bandpass frequency. In some embodiments, the filter may have a characteristic frequency that is greater than about 6 GHz, in some embodiments greater than about 8 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments in some embodiments greater than about 80 GHz.

The high frequency multilayer filter may include an inductor. The inductor may include a conductive layer formed over one of the plurality of dielectric layers. The inductor may be electrically connected at a first location with the signal path and electrically connected at a second location with at least one of the signal path or a ground. For example, the inductor may form a portion of the signal path or may be connected between the signal path and ground.

In some embodiments, the inductor may include at least one corner. The corner may have an angle greater than about 15 degrees, in some embodiments greater than about 30 degrees, in some embodiments greater than about 45 degrees, and in some embodiments greater than about 60 degrees (e.g., about 90 degrees). The inductor may have from one to nine corners, or more, in some embodiments, the inductor may have fewer than six corners, in some embodiments fewer than four corners, in some embodiments fewer than three corners, and in some embodiments fewer than two corners. In some embodiments, the inductor may be free of any corners. In some embodiments, the inductor may define a full "loop" or less. For example, the inductor may define less than one half of a "loop."

The inductor may include a first elongated section elongated in a first direction and having a first width and a second elongated section elongated in a second direction and having a second width. The first width may be approximately equal to the second width. The first direction may be greater than about 15 degrees from the second direction, in some embodiments greater than about 30 degrees, in some embodiments greater than about 45 degrees, and in some embodiments greater than about 60 degrees (e.g., about 90 degrees). In other words, a "corner" may be defined as a change of greater than 15 degrees between the first elongated section and the second elongated section.

In some embodiments, the inductor may have an effective length between the first location and the second location. The effective length may be defined as the length along the conductive layer between the first location and the second location. For example, the effective length may equal a sum of lengths of various straight portions of the inductor (e.g., in the X-Y plane) connected between the first location and the second location. The effective length of the inductor may be less than about 5 mm, in some embodiments less than about 3 mm, in some embodiments less than about 2 mm, in some embodiments less than about 1 mm, in some embodiments less than about 800 microns, in some embodiments less than about 500 microns, in some embodiments less than about 300 microns, in some embodiments less than about 200 microns, and in some embodiments less than about 100 microns.

In some embodiments, the conductive layer of the inductor may have a width that is less than about 1000 microns, in some embodiments less than about 500 microns, in some embodiments less than about 300 microns, in some embodiments less than about 200 microns, and in some embodiments less than about 100 microns.

In some embodiments, a ratio of the length to the width of the conductive layer of the inductor may range from about 0.5 to about 60, in some embodiments from about 0.8 to about 50, and in some embodiments from about 1 to about 30.

In some embodiments, at least some of the dielectric layers may have thicknesses that are less than about 180 microns, in some embodiments less than about 120 microns, in some embodiments less than about 100 microns in some embodiments less than about 80 microns, in some embodiments less than 60 microns, in some embodiments less than about 50 microns, in some embodiments less than about 40 microns, in some embodiments less than about 30 microns, and in some embodiments less than about 20 microns. For example, the conductive layer of the inductor may be formed over a dielectric layer having a thickness that is less than about 180 microns, in some embodiments less than about 100 microns, and in some embodiments less than about 80 microns.

One or more vias may be formed in the dielectric layers. The via(s) may electrically connect the different conductive layers. For example, a via may be formed in the dielectric layer on which the conductive layer of the inductor is formed. Such via may connect the inductor with another part of the filter, such as a portion of the signal path or the ground (e.g., a ground plane). In some embodiments, the length of such via in a Z-direction may be equal to the thickness of the dielectric layer in which such via is formed. For example, such via may have a length that is less than about 180 microns, in some embodiments less than about 100 microns, and in some embodiments less than about 80 microns.

In some embodiments, a series of vias and intermediary layers may be vertically arranged to connect the inductor with another conductive layer, such as the ground plane or a portion of the signal path. A total vertical length in the Z-direction of the series of vias and intermediary layers may range from about 10 microns to about 500 microns, in some embodiments from about 30 microns to about 300 microns, in some embodiments from about 40 microns to about 200 microns, and in some embodiments from about 60 microns to about 150 microns.

The via(s) may have a variety of suitable widths. For example, in some embodiments the width of the via may range from about 20 microns to about 200 microns, in some embodiments from about 40 microns to about 180 microns, in some embodiments from about 60 microns to about 140 microns, and in some embodiments from about 80 microns to about 120 microns.

In some embodiments, the filter may include a capacitor that has a small capacitive area (e.g., overlapping area between electrodes). For example, in some embodiments the capacitive area of the capacitor may be less than about 0.05 square millimeters ($mm^2$), in some embodiments less than about 0.04 $mm^2$, in some embodiments less than about 0.03 $mm^2$, in some embodiments less than about 0.02 $mm^2$, and in some embodiments less than about 0.015 $mm^2$.

The filter may include a first layer of a first dielectric material between electrodes of the capacitor(s). The first dielectric material may be a ceramic-filled epoxy. The first dielectric material may be distinct from a second dielectric material of another layer of the filter. For example, the first dielectric material between the electrodes may comprise a ceramic-filled epoxy. The first dielectric material may have a dielectric constant that ranges from about 5 to about 9, in some embodiments from about 6 to about 8. The second dielectric material may comprise an organic dielectric material, for example, as described above. The second dielectric material may have a dielectric constant that ranges from about 1 to about 5, in some embodiments from about 2 to about 4.

The filter may exhibit excellent performance characteristics, such as low insertion loss for frequencies within a pass band frequency range of the filter. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the filter may exhibit excellent rejection of frequencies outside the pass band frequency range. In some embodiments, the insertion loss for frequencies outside the pass band frequency range may be less than about −15 dB, in some embodiments less than about −25 dB, in some embodiments less than about −35 dB, and in some embodiments less than about −40 dB.

Additionally, the filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The filter may also exhibit consistent performance characteristics (e.g., insertion loss, return loss, etc.) across a wide range of temperatures. In some embodiments, the insertion loss of the filter may vary less than 5 dB or less across large temperature ranges. For example, the filter can exhibit a first insertion loss at about 25° C. and at a first frequency. The filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

In some embodiments, the filter may have an overall length that ranges from about 0.5 mm to about 30 mm, in some embodiments, from about 1 mm to about 15 mm, and in some embodiments from about 2 mm to about 8 mm.

In some embodiments, the filter may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The filter may generally be low-profile or thin. For example, in some embodiments, the filter may have an overall thickness that ranges from about 100 microns to about 2 mm, in some embodiments from about 150 microns to about 1 mm, and in some embodiments from about 200 microns to about 300 microns.

I. High Frequency Multilayer Filter

FIG. 1 is a simplified schematic of a high frequency multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
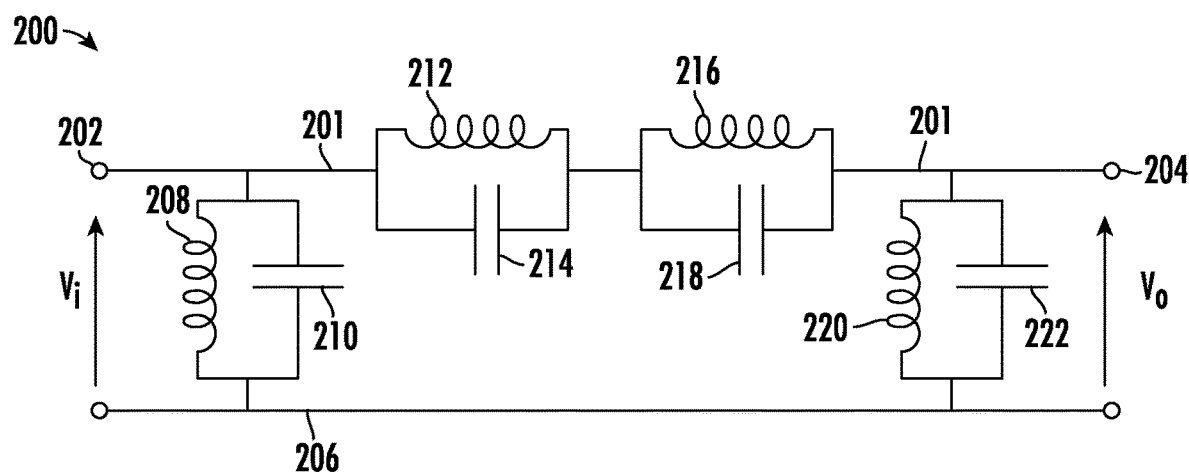
FIG. 2 is a simplified schematic of another band pass filter according to aspects of the present disclosure.

FIG. 2 is a schematic of an example embodiment of a band pass filter 200 according to aspects of the present disclosure. A signal path 201 may be defined between an input 202 and an output 204 of the filter 200. An input voltage (represented by $V_i$ in FIG. 1) may be input to the filter 200 between the input 202 and a ground 206 of the filter 200. An output voltage (represented by $V_o$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 210 and third capacitor 214 electrically connected in parallel with each other. The third inductor 210 and third capacitor 214 may be electrically connected between the signal path 201 and the ground 206. The third inductor 210 and third capacitor 214 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired band pass frequency range of the band pass filter 200. The band pass filter 200 may significantly reduce frequencies outside of the passband frequency range while allowing frequencies within a passband frequency range to be transmitted through the filter 200 substantially unaffected.

Figure 3A:
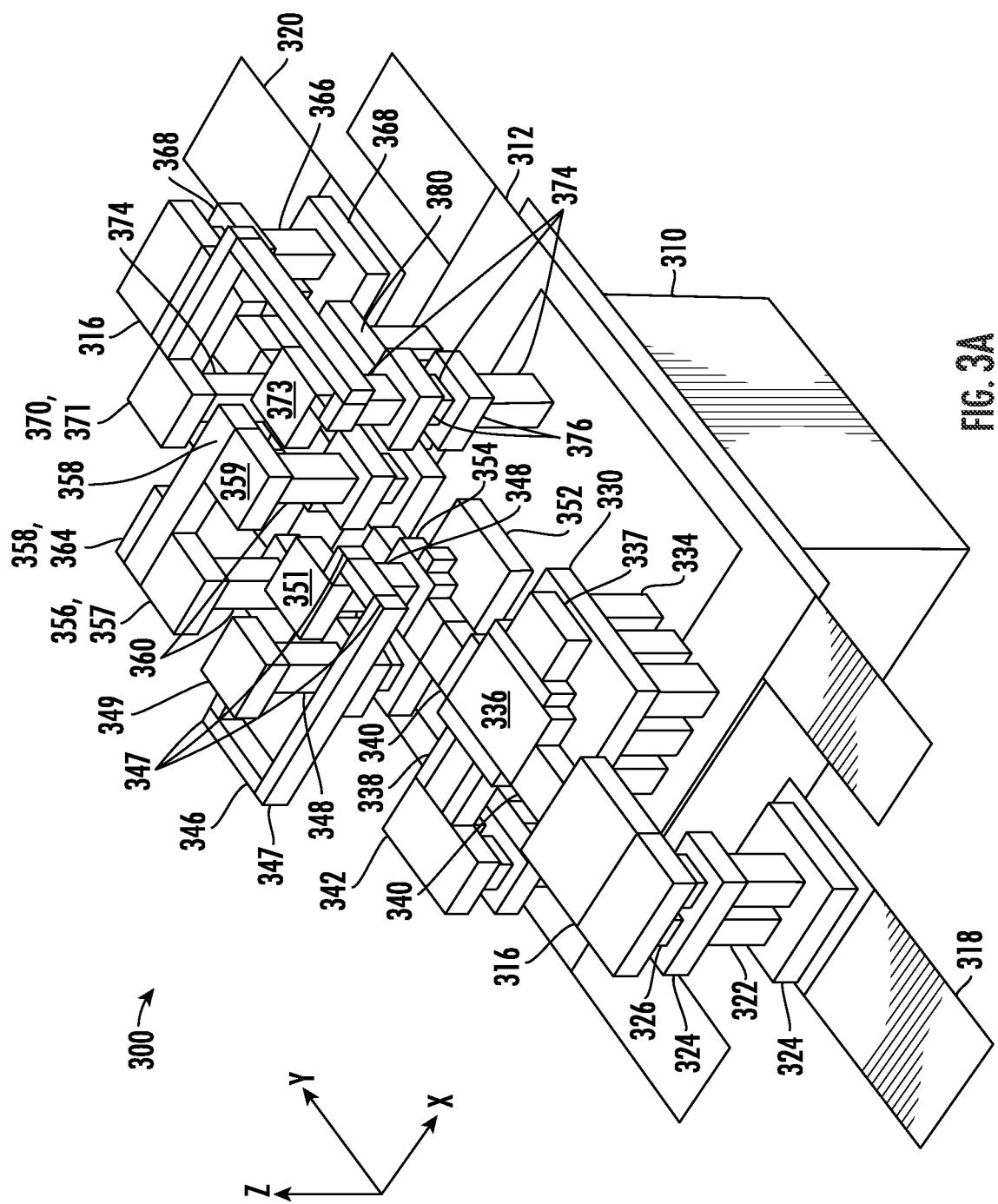
FIGS. 3A and 3B are perspective views of an example band pass filter according to aspects of the present disclosure.
Figure 3B:
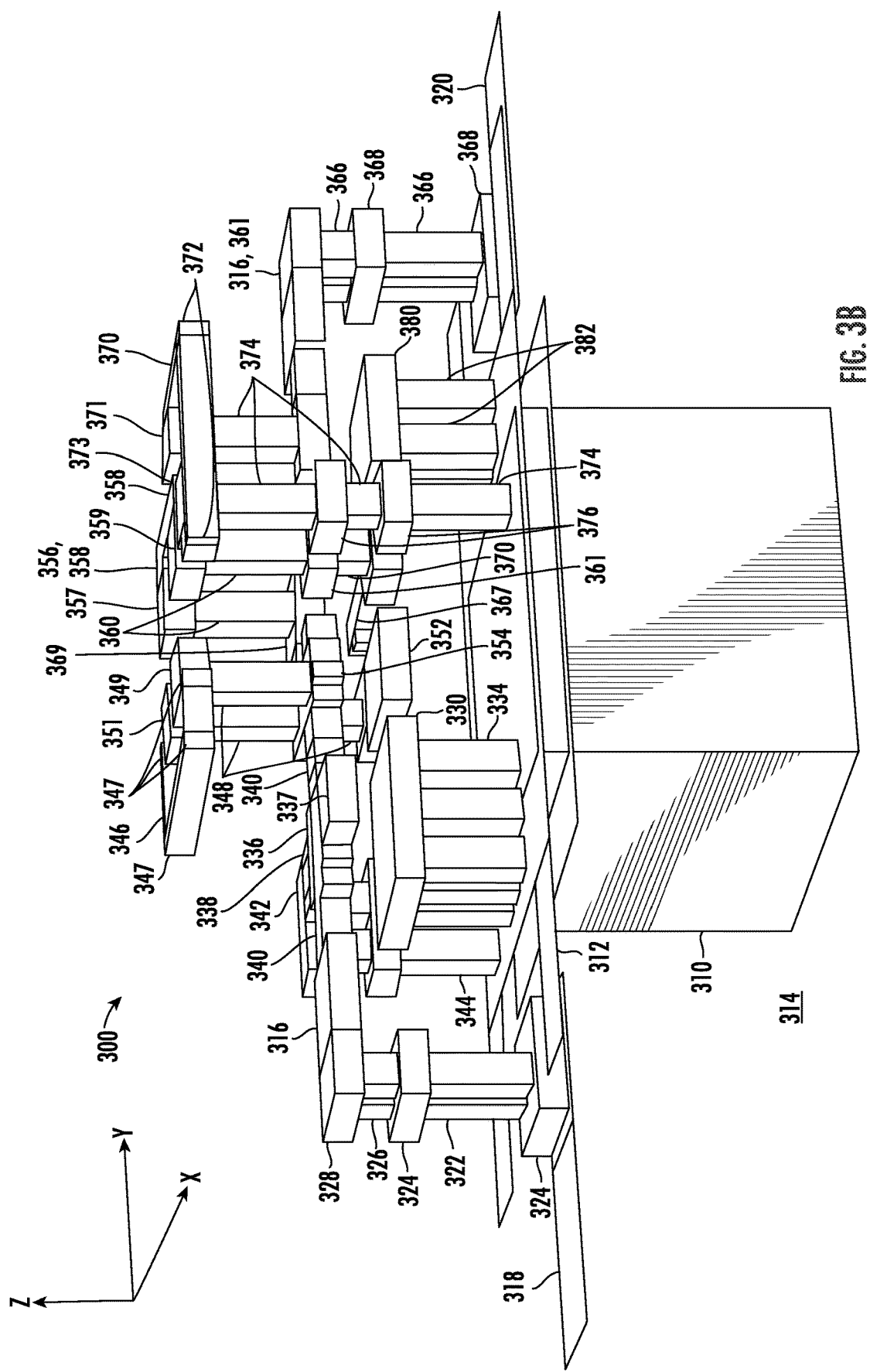
Figure 3C:
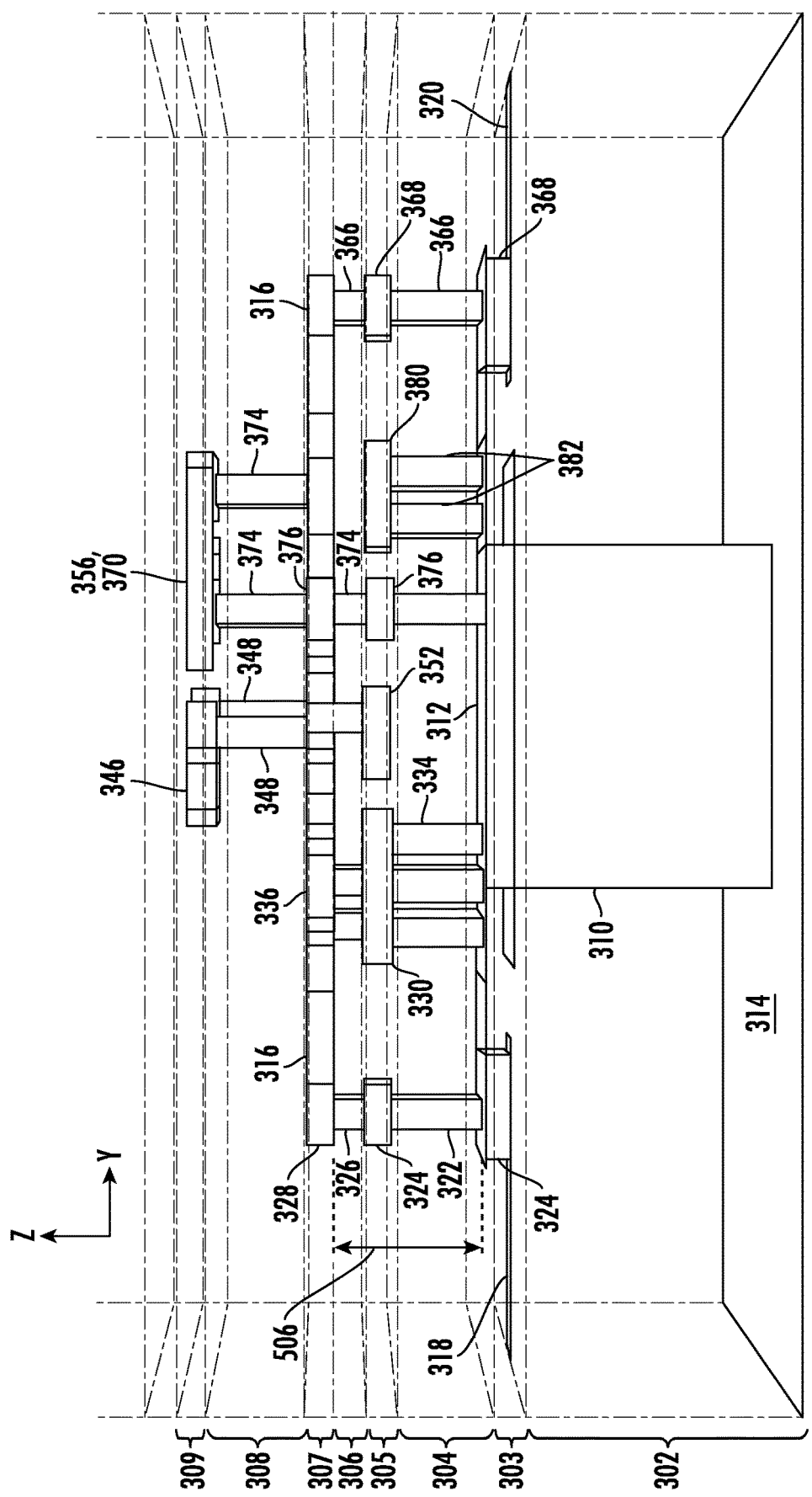
FIG. 3C is a side elevation view of the filter of FIGS. 3A and 3B.

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed over the dielectric layers 304, 306, 308. Conductive layer 303 may be formed over a bottom surface of the first dielectric layer 304. Conductive layers 305, 307 may be formed over a top surface and a bottom surface, respectively of the second dielectric layer 306. A ground may include a ground plane 312 that is exposed and/or terminated along a bottom surface of the filter 300 (the bottom surface of conductive layer 303. The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the mounting surface 302 and the first conductive layer 303. FIG. 4B illustrates the ground plane 312 formed over the bottom surface of the first dielectric layer 304. FIG. 4C additionally illustrates the conductive layer 305 formed over the top surface of the first dielectric layer 304. FIG. 4D additionally illustrates conductive layer 307 that is formed over the second dielectric layer 306. FIG. 4E illustrates the conductive layer 309 formed over the third layer 308. The dielectric layers 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 may electrically connecting the input 318 with an intermediary conductive layer 324 disposed between the first layer 304 and second layer 306. The signal path 316 may include one or more vias 326 electrically connecting the intermediary layer 324 with a conductive layer 328 formed over the second dielectric layer 306.

A first capacitor may be formed between a portion 336 of the signal path 316 formed over an upper surface of the second layer 360 and a conductive layer 330 formed over a lower surface of the second layer 306 of dielectric material. The second layer 306 may have a different dielectric constant than one or more of the other layers 304, 308. For example, the dielectric material of the second layer 306 having a dielectric constant that ranges from about 5 to about 8 in accordance with IPC TM-650 2.5.5.3 at an operating temperature of 25° C. and frequency of 1 MHz. One or more of the other layers 304, 308 may have a dielectric constant that ranges from about 1 to about 4 in accordance with IPC TM-650 2.5.5.3 at an operating temperature of 25° C. and frequency of 1 MHz.

The conductive layer 330 may be electrically connected with the ground plane 312. The first capacitor of the filter 300 may correspond with the first capacitor 210 of the circuit diagram 200 of FIG. 2. The conductive layer 330 may be capacitively coupled with a portion 336 of the signal path 316. The conductive layer 330 may be spaced apart from the portion 336 of the signal path 316 in a Z-direction. The conductive layer 330 may be electrically connected with the ground plane 312 by one or more vias 334.

The first capacitor may be insensitive to relative misalignment of the electrodes of the first capacitor, which may be described as being "self-aligning." As best seen in FIG. 4D, the portion 336 of the signal path 316 may generally be dimensionally smaller (e.g., in the X- and Y-directions) than the conductive layer 330 of the first capacitor. Additionally the portion 336 of the signal path 316 may define connections in the X-Y plane with other elements and other parts of the signal path 316. Such connections may be sized such that a slight misalignment in the X-direction or Y-direction does not change a capacitive area of the first capacitor. More specifically, a size of an effective overlap area (e.g., in the X-Y plane) between the conductive layer 330 and the portion 336 of the signal path 316 may be insensitive to slight misalignment in the X-direction or Y-direction of the second and third layers 304, 306.

For example, the portion 336 of the signal path 316 may include a tab 337 (e.g., extending in the X-direction) that has a width (e.g., in the Y-direction) equal to a width (e.g., in the Y-direction) of the connector portion 338 on an opposite side of the portion 336. Similarly, connections 340 may extend from opposite sides of the portion 336 (e.g., in the Y-direction) that may have equal widths. As a result, relative misalignment in the Y-direction may not alter the overlapping area between the conductive layer 330 and the portion 336 of the signal path 316.

The filter 300 may include a first inductor 342 electrically connected with the signal path 316 and ground plane 312. The first inductor 342 of the filter 300 may correspond with the first inductor 208 of the circuit diagram 200 of FIG. 2.

The first inductor 342 may be connected with the portion 336 of the signal path 316 that forms the first capacitor by connector portion 338. The first inductor 342 may be electrically connected with the ground plane 312 by one or more vias 344 (best seen in FIG. 3B).

The signal path 316 of the filter 300 may include a second inductor 346, which may correspond with the second inductor 212 of the circuit diagram 200 of FIG. 2. The second inductor 346 may be formed over the third layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the first inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the first inductor 346 may form greater than half of a "loop."

The second capacitor may be formed between the conductive layer 352 and the portion 354 of the signal path 316. The second capacitor may correspond with the second capacitor 214 of the circuit diagram 200 of FIG. 2. The second capacitor may be a self-aligning capacitor. As best seen in FIG. 4D, the portion 354 of the signal path 316 may be shaped such that a size of a capacitive area (e.g., overlapping area in the X-Y plane) between the conductive layer 352 and the portion of the signal path 316 is insensitive to small misalignment between the second layer 304 and the third layer 306.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by one or more vias 366 and/or intermediary layers 368. In other words, the third inductor 356 may form a portion of the signal path 316 between the second inductor 346 and the output 320.

The third inductor 356 may include a line width addition 364. The line width addition 364 may include a portion of the conductive material that forms the third inductor 356, for example as described below with reference to FIG. 5C. The line width addition 364 may extend across at least a portion of the third inductor such that the third inductor 356 has a greater width at the line with addition 364 than other parts of the third inductor 356.

A third capacitor may be formed in parallel with third inductor 356. The third capacitor may correspond with the third capacitor 214 of the circuit diagram 200 of FIG. 2. The third capacitor of the filter 300 may include a conductive layer 367 that is capacitively coupled with the portion 369 (best seen in FIG. 4D) of the signal path 316. The third capacitor may be a self-aligning capacitor such that the size of the capacitive area is insensitive to relative misalignment between the second and third dielectric layers 304, 306.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2 The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 that is capacitively coupled with the portion 361 of the signal path 316 that is connected with the output 320. The conductive layer 380 of the fourth capacitor may be electrically connected with the ground plane 312 by vias 382. The fourth capacitor may correspond with the fourth capacitor 222 of the circuit diagram 200 of FIG. 2. The fourth capacitor may be self-aligning, for example as described above with reference to the first capacitor.

Figure 5A:
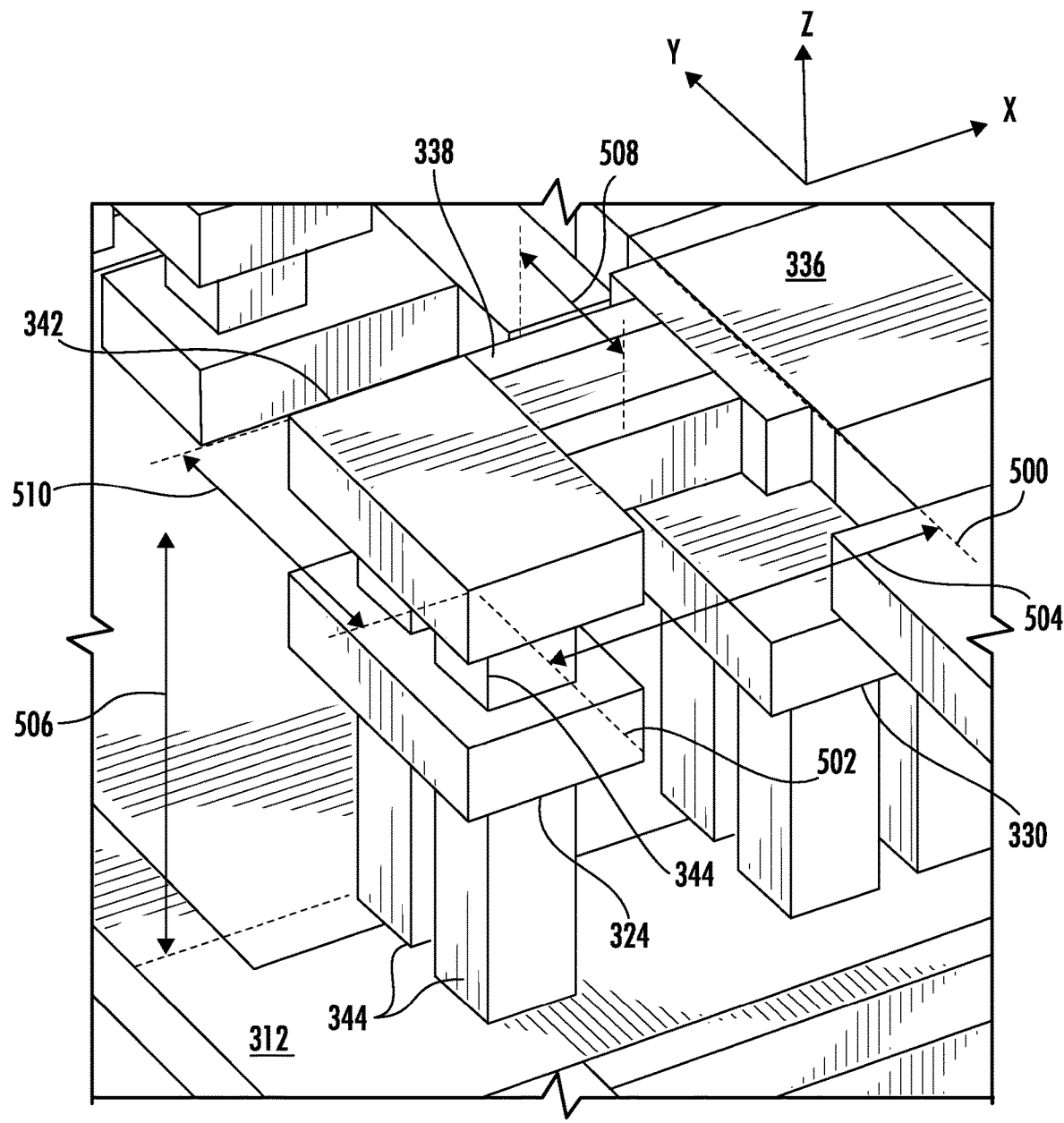
FIGS. 5A through 5D are enlarged perspective views of a first inductor, a second inductor, a third inductor, and a fourth inductor, respectively, of the filter of FIGS. 3A through 3C, FIGS. 6A and 6B are perspective views of another embodiment of a multilayer filter according to aspects of the present disclosure.
Figure 5B:
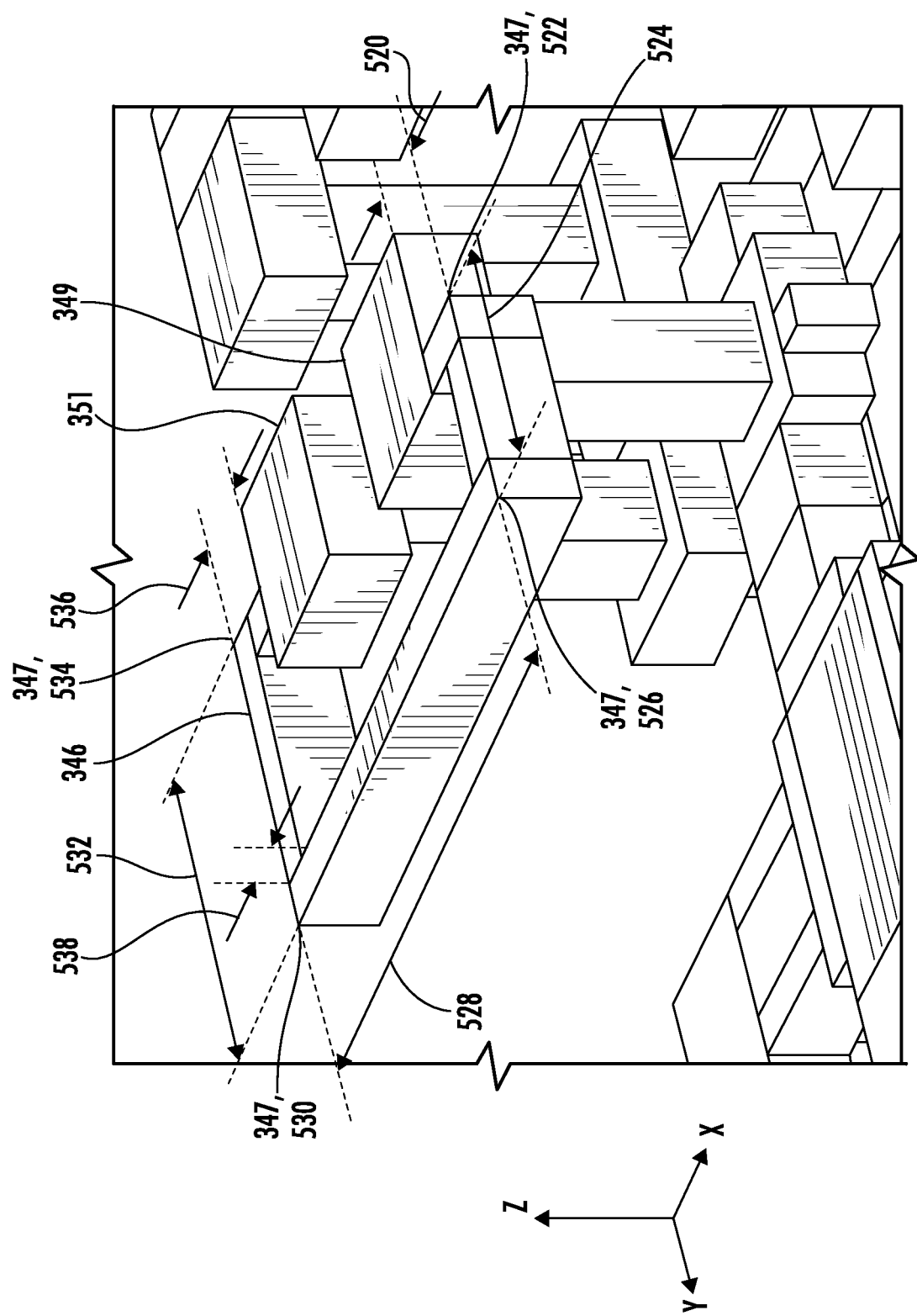

FIGS. 5A through 5D are enlarged perspective views of the first inductor 342, second inductor 346, third inductor 356, and fourth inductor 370, respectively. Referring to FIG. 5A, the first inductor 342 may be connected with or include the connector portion 338, such that the first inductor 342 is connected with portion 336 of the signal path 316 at a first location 500 and connected with the ground plane 312 at a second location 502 by a vertical connection of one or more vias 344 and the intermediary conductive layer 324. An effective length 504 of the first inductor 342 may be defined between the first location 500 and the second location 502. The effective length 504 may be selected to produce the desired inductance value of the first inductor 342.

A vertical connection formed between the first inductor 342 and the ground plane 312 by one or more vias 322, 326 and the intermediary conductive layer 324. The total vertical length 506 may be equal to the sum of thicknesses of the second dielectric layer 304, the conductive layer 305 formed over the second dielectric layer 304, and the third dielectric layer 306 (FIG. 3C).

The connector portion 338 may have a width 508 in the Y-direction. The first inductor 342 may have a width 510 in the Y-direction. The inductance of the first inductor 342 may be dependent on the width 508 of the connector portion 338, the width 510 of the first inductor 342, and/or the effective length 504 of the first inductor 342.

Referring to 5B, the second inductor 346 may have an effective length between the first location 349 and the second location 351 along the conductive layer of the second inductor 346. The second inductor 346 may include a plurality of elongated sections having respective lengths. The effective length may be defined as the sum of lengths along the second inductor 346 in the X-Y plane. For example, a first length 520 may be defined in the X-direction between the first location 349 and a first corner 522 of the corners 347; a second length 524 may be defined in the Y-direction between the first corner 522 and a second corner 526; a third length 528 may be defined in the X-direction between the second corner 526 and a third corner 530; a fourth length 532 may be defined in the Y-direction between the third corner 530 and a forth corner 534; and a fifth length 536 may be defined in the X-direction between the fourth corner 534 and the second location 351. The effective length may be defined as the sum of the first length 520, second length 524, third length 528, fourth length 532, and fifth length 536. The second inductor 346 may have a width 538 along the effective length of the second inductor 346. In other words, the inductor may have an approximately uniform width 538 along each elongated section (e.g., the first length 520, second length 524, third length 528, and/or fourth length 532). Each corner 522, 526, 530, 534 may be defined as a change in direction of the conductive layer of the second inductor 346 in the X-Y plane that is greater than about 15 degrees (e.g., about 90 degree).

Figure 5C:
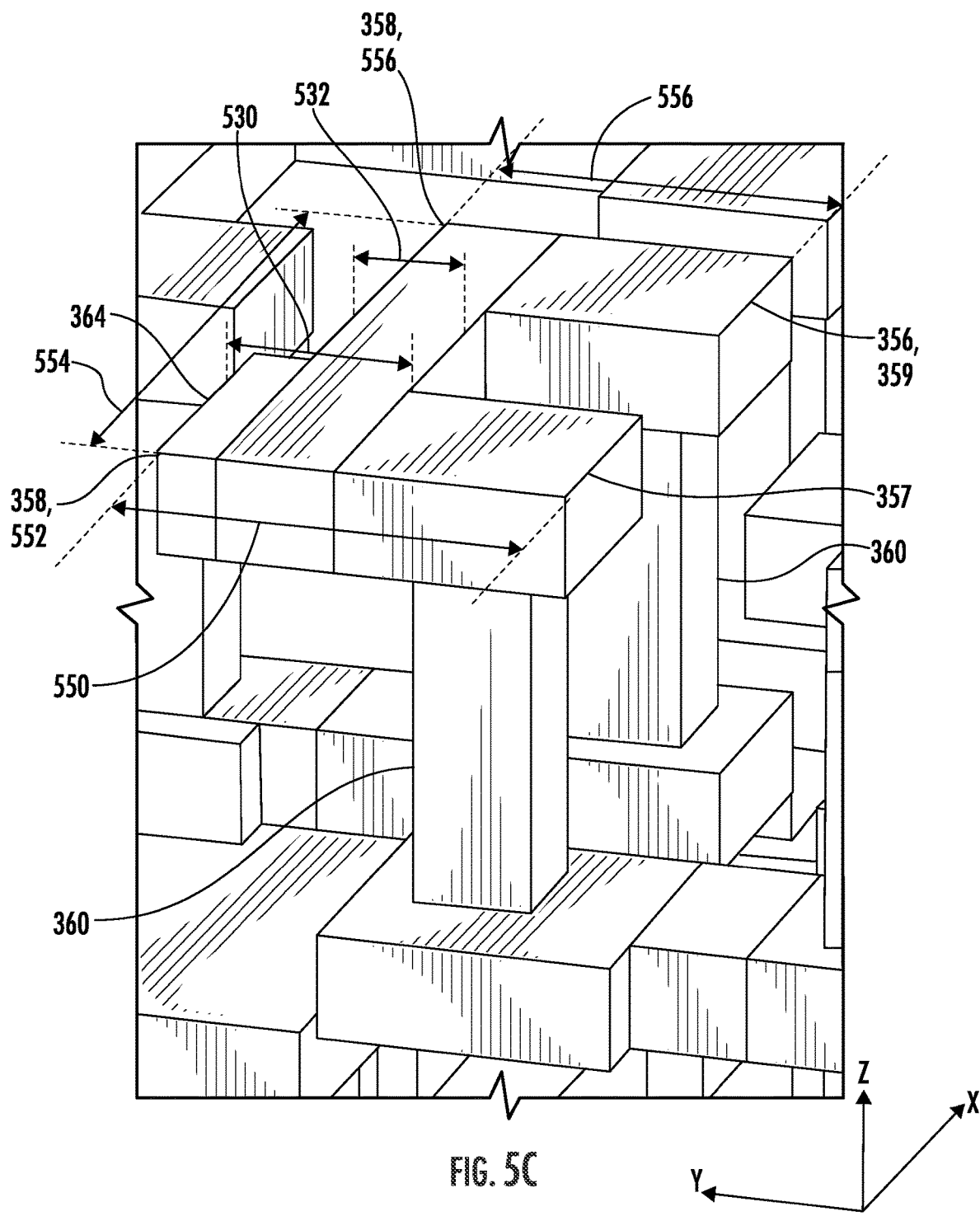

Referring to FIG. 5C, the third inductor 356 may have an effective length between the first location 357 of the third inductor 356 and the second location 359 of the third inductor 356 along the conductive layer of the third inductor 356. The effective length may be defined as the sum of lengths along the third inductor 356 in the X-Y plane. For example, a first length 550 may be defined in the Y-direction between the first location 357 and a first corner 552; a second length 554 may be defined in the X-direction between the first corner 552 and a second corner 556; a third length 556 may be defined in the Y-direction between the second corner 556 and the second location 359. The effective length may be defined as the sum of the first length 550, second length 552, and third length 556.

The third inductor 356 may have a first width 530 at the line width addition 364. The third inductor 356 may have a second width 532 along other portions of the third inductor 356.

Figure 5D:
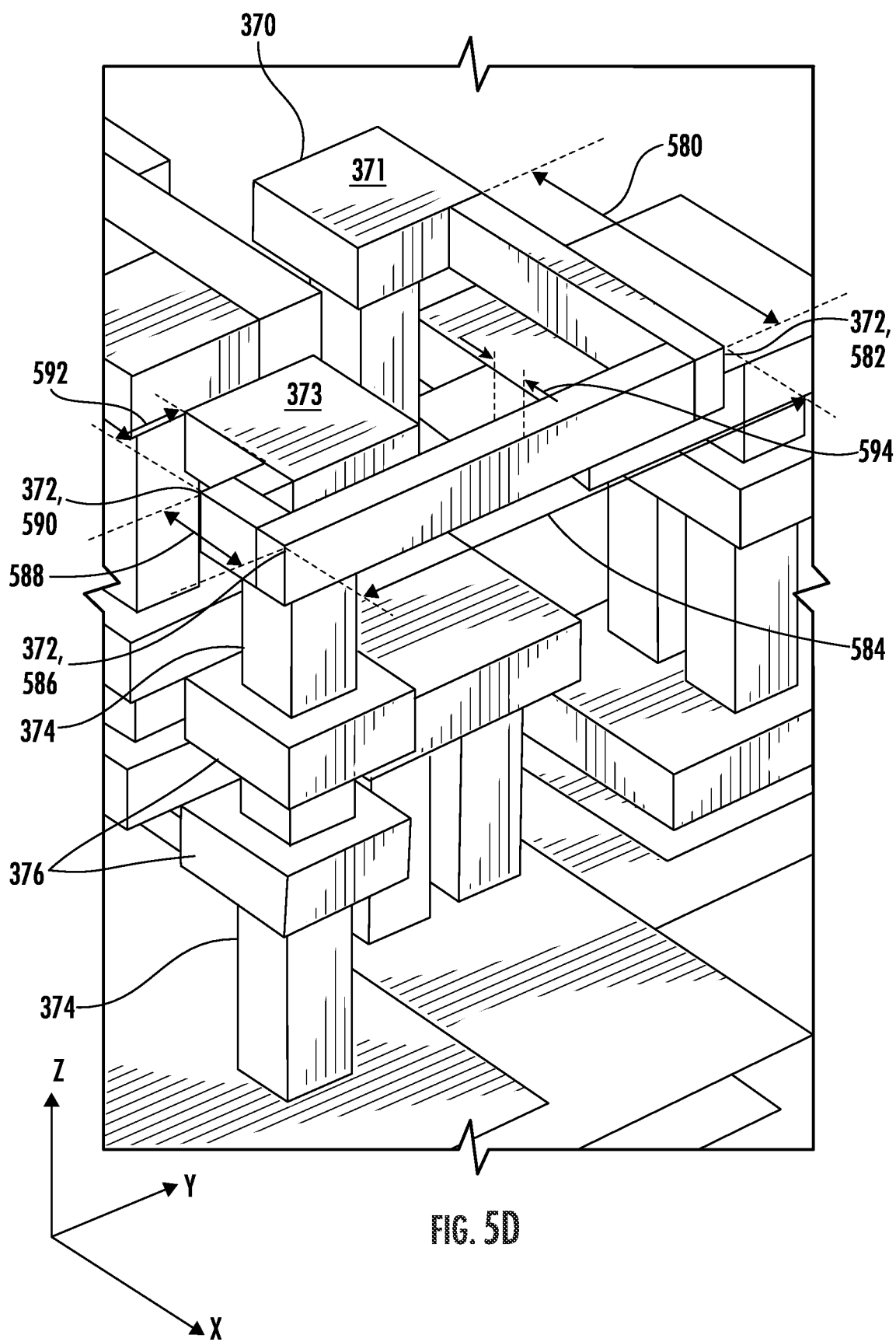

Referring to FIG. 5D, the fourth inductor 370 may similarly have an effective length equal to the sum of lengths of the fourth inductor 370 in the X-Y plane. For example the fourth inductor 370 may have an effective length between the first location 371 and the second location 373 along the conductive layer of the fourth inductor 370. The effective length may be defined as the sum of lengths along the fourth inductor 370 in the X-Y plane. For example, a first length 580 may be defined in the X-direction between the first location 371 and a first corner 582; a second length 584 may be defined in the Y-direction between the first corner 582 and a second corner 586; a third length 588 may be defined in the X-direction between the second corner 586 and a third corner 590; and a fourth length 592 may be defined in the Y-direction between the third corner 590 and the second location 351. The effective length may be defined as the sum of the first length 580, second length 584, third length 588, and fourth length 592. The fourth inductor 370 may have a width 594 along the effective length of the fourth inductor 370.

II. Additional Example Embodiments

Figure 6A:
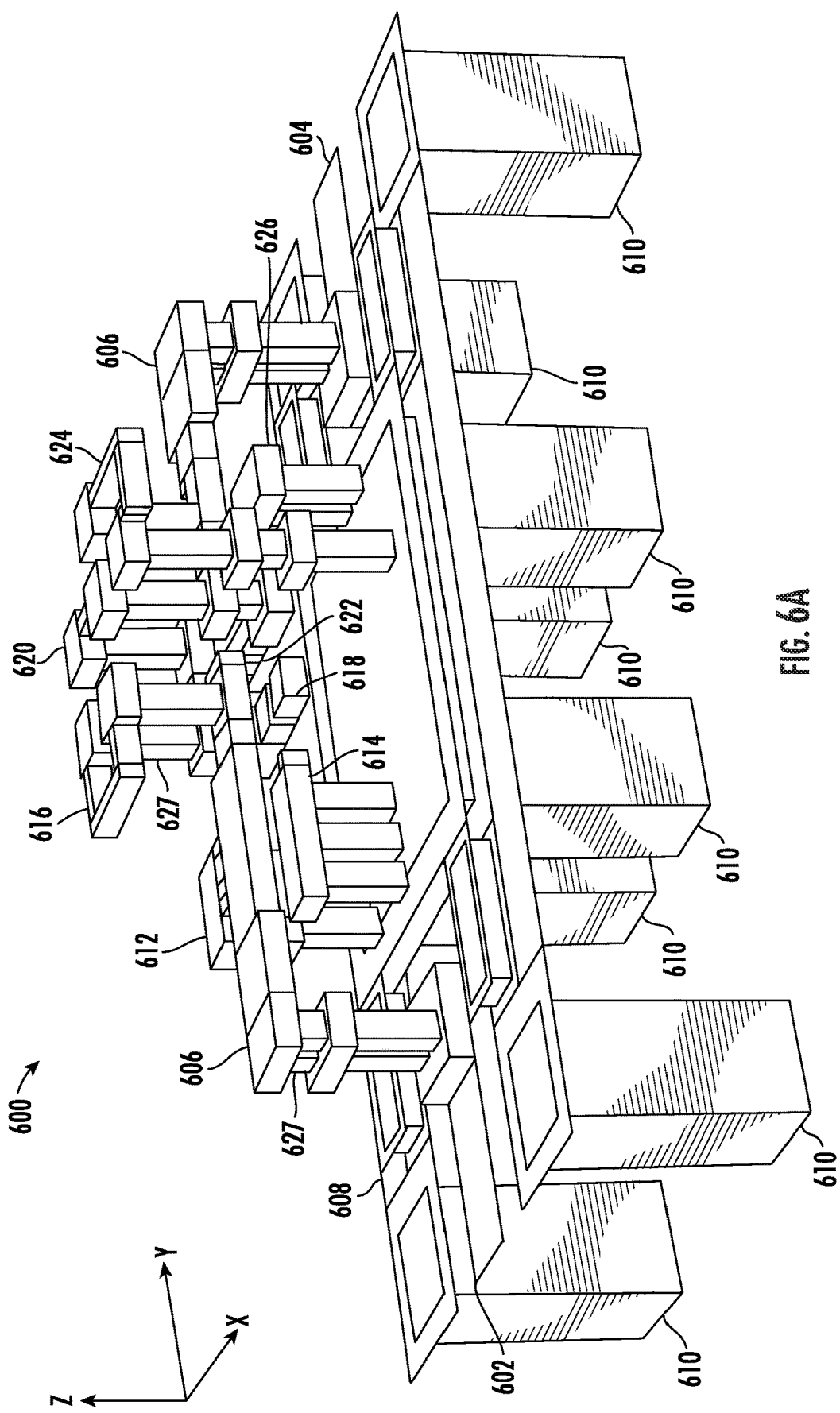
FIG. 6C is a side elevation view of the filter of FIGS. 6A and 6B.
Figure 6B:
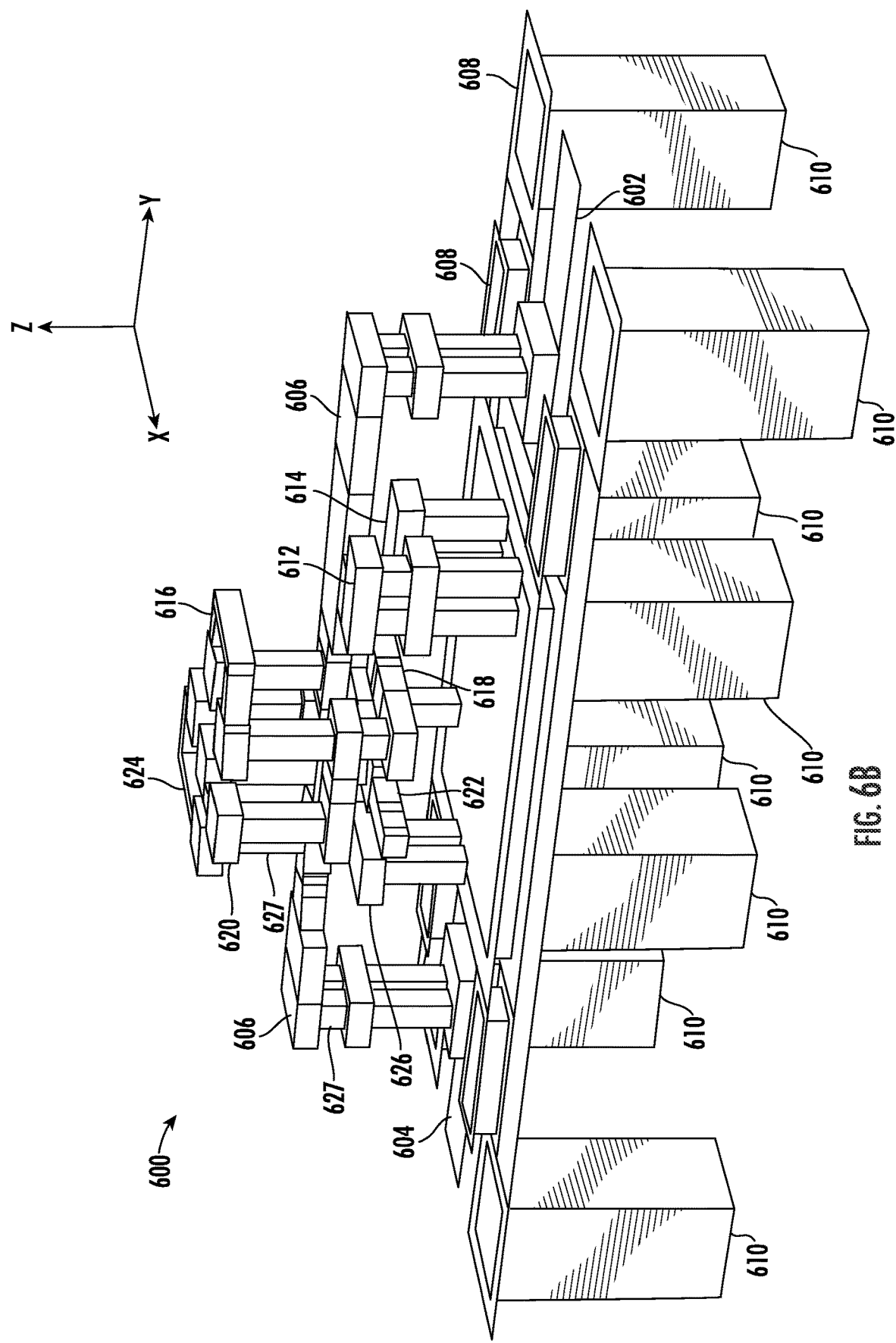

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5D. The filter 600 may include an input 602, an output 604, and a signal path 606 connecting the input 602 and the output 604. The filter 600 may also include a ground plane 608 electrically connected with one or more ground electrodes 610.

The filter 600 may include a first inductor 612 that is electrically connected with the ground plane 608. The first inductor 612 may correspond with the first inductor 208 of the circuit diagram 200 described above with reference to FIG. 2. The filter 600 may include a first capacitor 614 electrically coupled with the ground plane 608. The first capacitor 614 may correspond with the first capacitor 210 of the circuit diagram 200 described above with reference to FIG. 2. The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output 604. The filter 600 may include a third inductor 620 and third capacitor 622 that are connected in parallel with each other and may form a portion of the signal path 606 between the input 602 and the output 604. The third inductor 620 and third capacitor 622 may correspond with the third inductor 216 and third capacitor 218, respectively, of the circuit diagram 200 described above with reference to FIG. 2. Lastly, the filter 600 may include a fourth inductor 624 and fourth capacitor 626 that are connected in parallel with each other and connected between the signal path 606 and the ground plane 608. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias 627 in a similar manner as described above with reference to FIGS. 3 through 5D. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure. Conductive layers 630, 634, 638, 642 may be formed over the dielectric layers 632, 636, 640. Conductive layer 630 may be formed on a bottom surface of the first dielectric layer 632. Conductive layers 634, 638 may be formed on a top surface and a bottom surface, respectively of the second dielectric layer 636. Conductive layer 642 may be formed over a top surface of the third dielectric layer 640.

FIGS. 7A through 7D are a series of sequential top down views of the filter 600 of FIGS. 6A through 6C in which an additional dielectric layer is shown in each Figure. More specifically, FIG. 7A illustrates a mounting surface 628, such a printed circuit board. The first conductive layers 630 may include the ground plane 608, which may be formed on a bottom surface and a top surface of the first layer 632. FIG. 7B additionally illustrates the second conductive layer 634 formed over the first dielectric layer 632. The second conductive layer 634 may include the first capacitor 614, second capacitor 618, third capacitor 622 and forth capacitor 626. FIG. 7C additionally illustrates the third conductive layer 638 that is formed over the second dielectric layer 636. The third conductive layer 638 may include portions of the signal path 606 and the first inductor 612. FIG. 7D illustrates the fourth conductive layer 642 formed over the fourth dielectric layer 640. The fourth conductive layer 642 may include the second inductor 616, third inductor 622, and fourth inductor 624. The dielectric layers 632, 636, 640 are transparent to show the relative relocations of the various patterned conductive layers 630, 634, 638, 642.

Figure 8A:
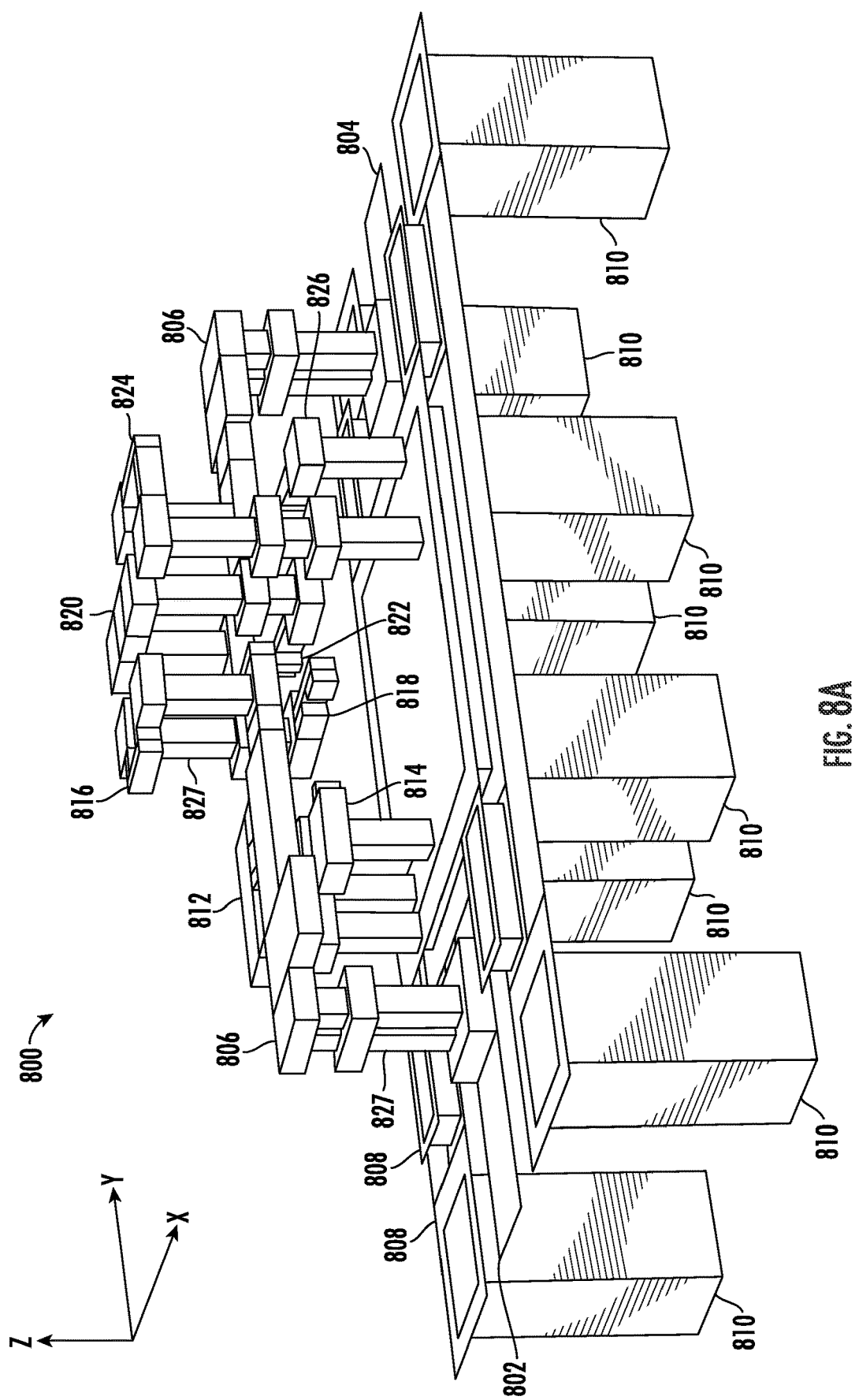
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5D. The filter 800 may include an input 802, an output 804, and a signal path 806 connecting the input 802 and the output 804. The filter 800 may also include a ground plane 808 electrically connected with one or more ground electrodes 810.

The filter 800 may include a first inductor 812 that is electrically connected with the ground plane 808. The first inductor 812 may correspond with the first inductor 208 of the circuit diagram 200 described above with reference to FIG. 2. The filter 800 may include a first capacitor 814 electrically coupled with the ground plane 808. The first capacitor 814 may correspond with the first inductor capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. Lastly, the filter 800 may include a fourth inductor 824 and fourth capacitor 826 that are connected in parallel with each other and connected between the signal path 806 and the ground plane 808. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias 827 in a similar manner as described above with reference to FIGS. 3 through 5D. Each of the inductors 812, 818, 820, 824 may be connected with the signal path 806 at a respective first location and connected with the signal path 806 or the ground plane 808 at a respective second location. Each of the inductors 812, 818, 820, 824 may have a respective effective length (e.g., in the X-Y plane) between the first location and the second location. Additionally, each of the inductors 812, 818, 820, 824 may have a respective width along its respective effective length.

Figure 8B:
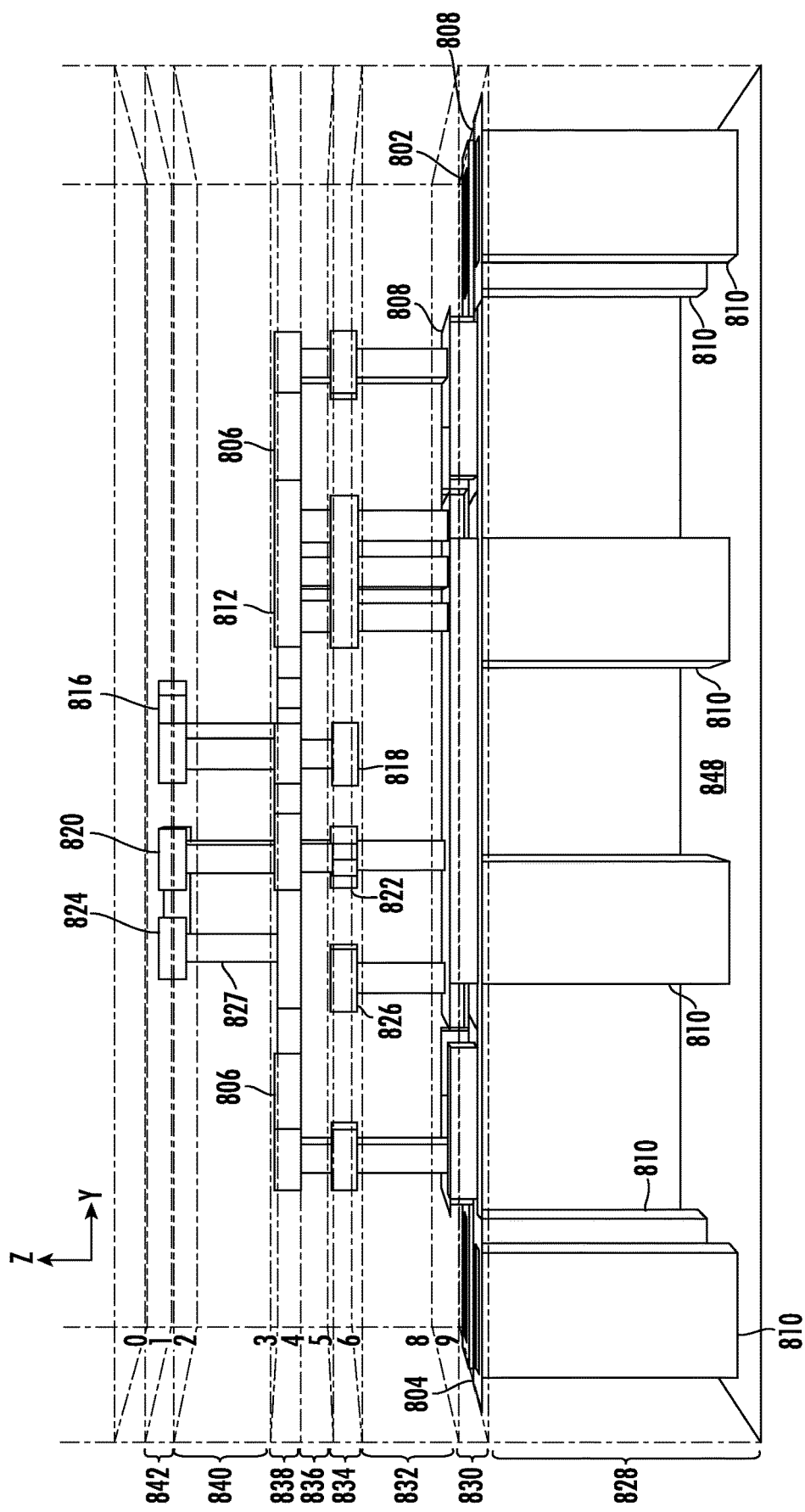
FIG. 8B is a side elevation view of the filter of FIG. 8A.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed over the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed over a top surface of the third dielectric layer 840.

Figure 9B:
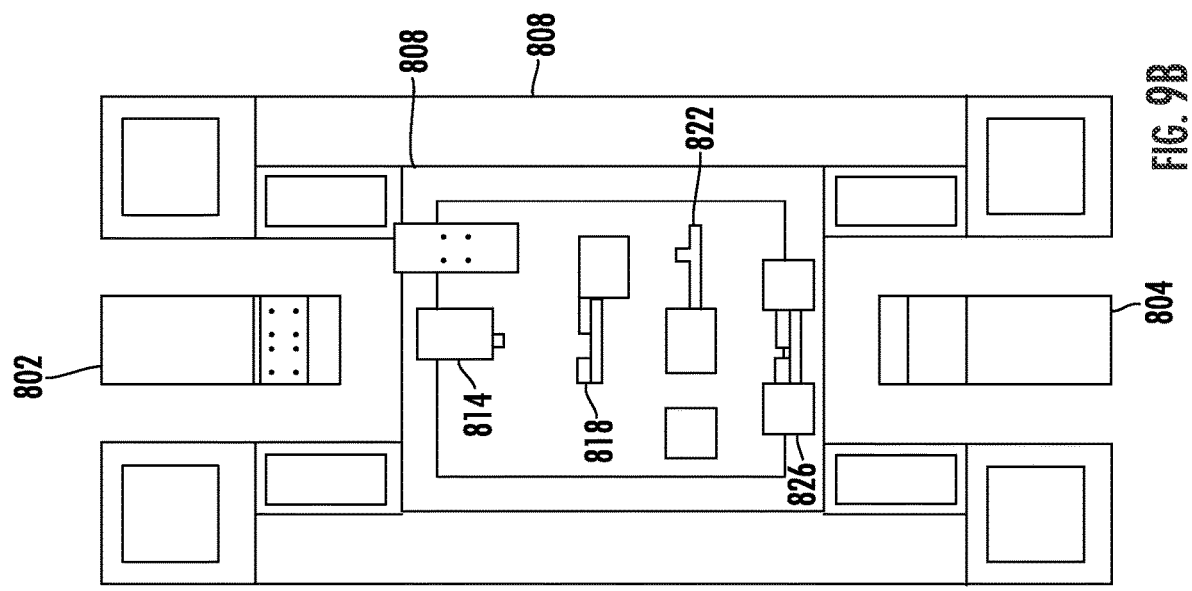
Figure 9A:
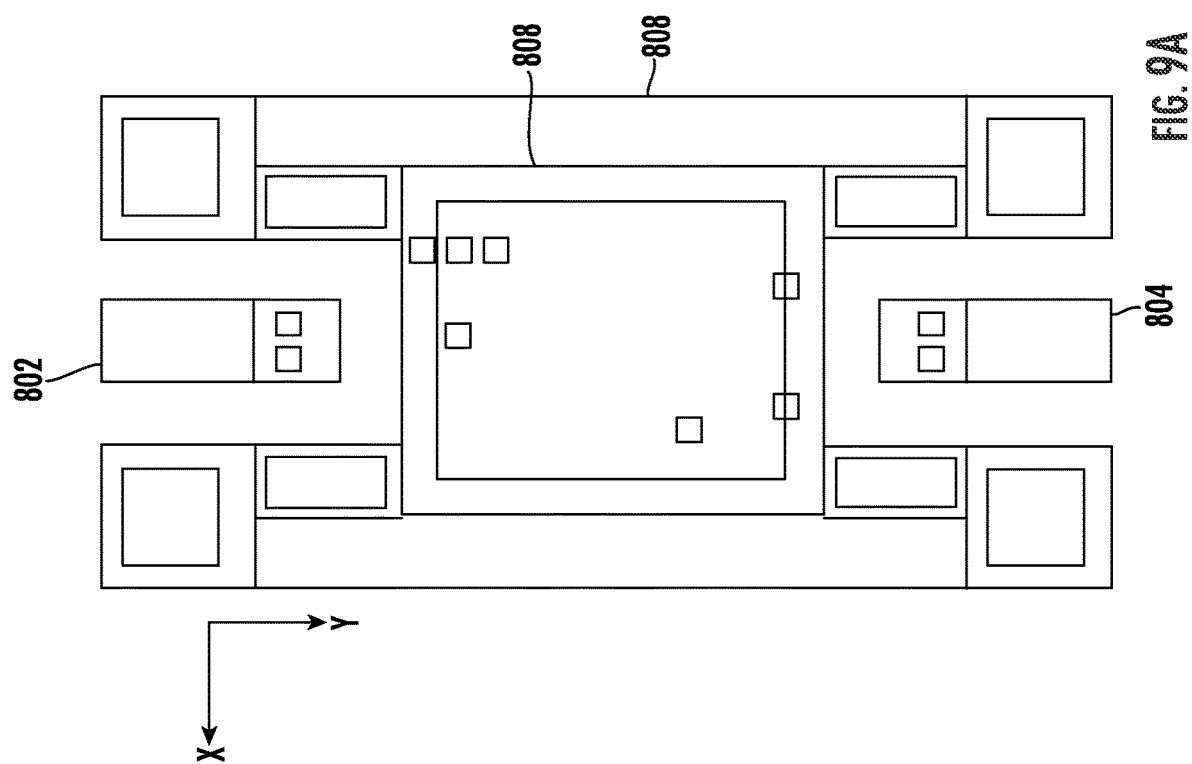

FIGS. 9A through 9D are a series of sequential top down views of the filter 600 of FIGS. 8A and 8B in which an additional dielectric layer is shown in each Figure. More specifically, FIG. 9A illustrates a mounting surface 828, such as a printed circuit board. The first conductive layers 830 may include the ground plane 808, which may be formed on a bottom surface and a top surface of the first layer 832. FIG. 9B additionally illustrates the second conductive layer 834 formed over the first dielectric layer 832. The second conductive layer 834 may include the first capacitor 814, second capacitor 818, third capacitor 822 and forth capacitor 826. FIG. 9C additionally illustrates the third conductive layer 838 that is formed over the second dielectric layer 836. The third conductive layer 838 may include portions of the signal path 806 and the first inductor 812. FIG. 9D illustrates the fourth conductive layer 842 formed over the fourth dielectric layer 840. The fourth conductive layer 842 may include the second inductor 816, third inductor 822, and fourth inductor 824. The dielectric layers 832, 836, 840 are transparent to show the relative relocations of the various patterned conductive layers 830, 834, 838, 842.

Figure 10A:
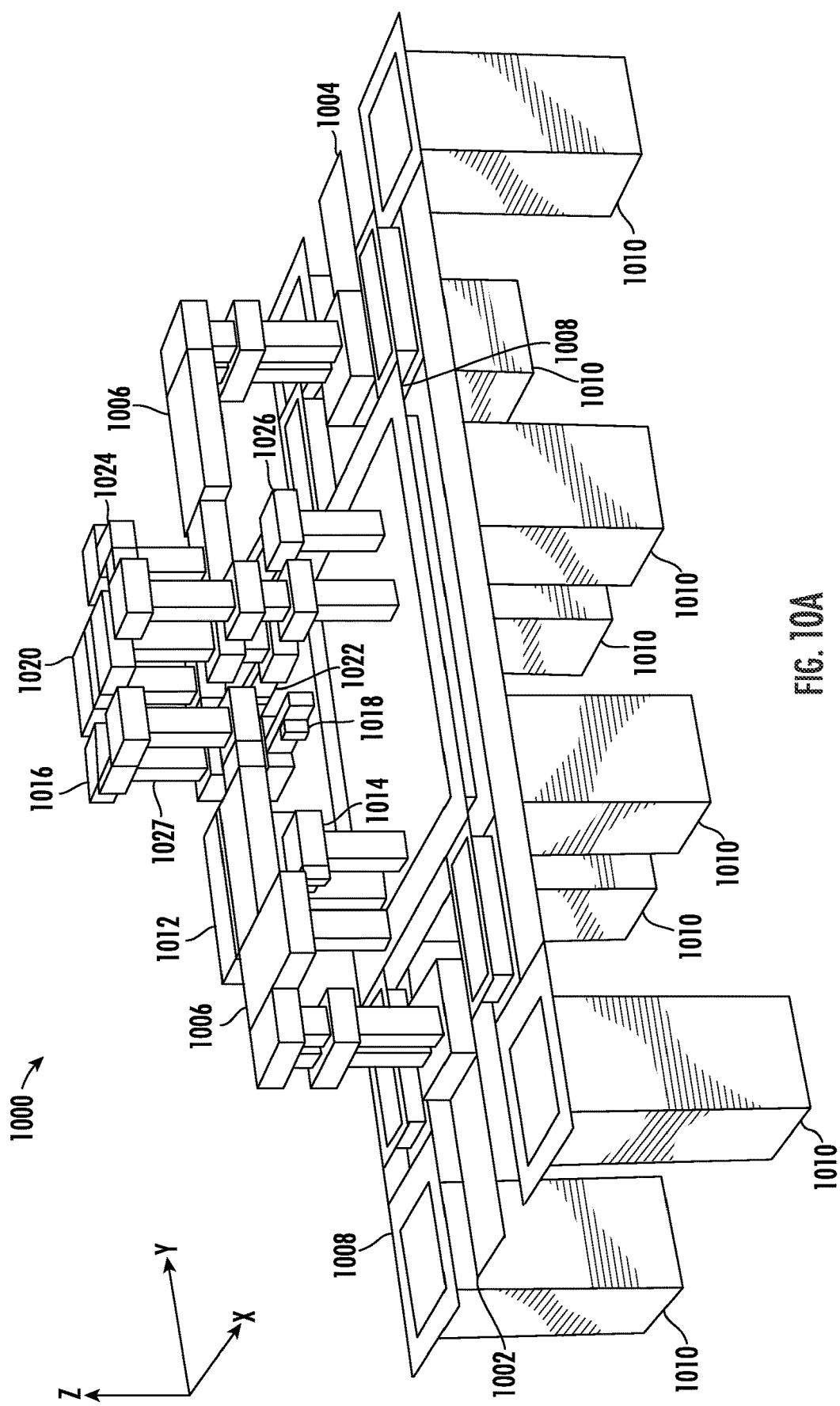
FIG. 10A is a perspective view of another embodiment of a multilayer filter according to aspects of the present disclosure.
Figure 10B:
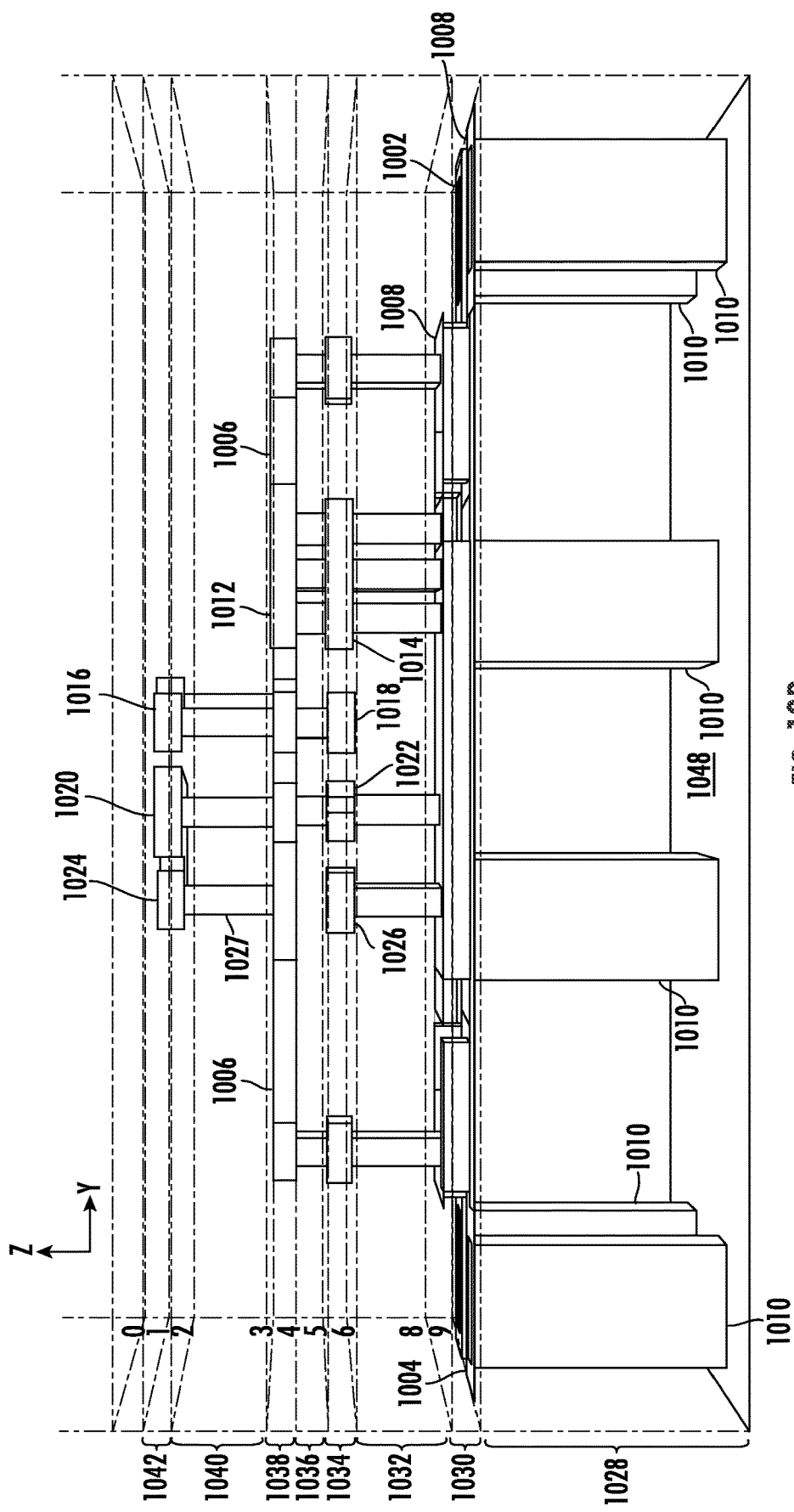
FIG. 10B is a side elevation view of the filter of FIG. 10A.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5D. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008. The first capacitor 1014 may correspond with the first inductor capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. Lastly, the filter 1000 may include a fourth inductor 1024 and fourth capacitor 1026 that are connected in parallel with each other and connected between the signal path 1006 and the ground plane 1008. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias 1027 in a similar manner as described above with reference to FIGS. 3 through 5D. Each of the inductors 1012, 10110, 1020, 1024 may be connected with the signal path 1006 at a respective first location and connected with the signal path 1006 or the ground plane 1008 at a respective second location. Each of the inductors 1012, 10110, 1020, 1024 may have a respective effective length (e.g., in the X-Y plane) between the first location and the second location. Additionally, each of the inductors 1012, 10110, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed over the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed over a top surface of the third dielectric layer 1040.

FIGS. 11A through 11D are a series of sequential top down views of the filter 600 of FIGS. 10A and 10B in which an additional dielectric layer is shown in each Figure. More specifically, FIG. 11A illustrates a mounting surface 1028, such a printed circuit board. The first conductive layer 1030 may include the ground plane 1008, which may be formed on a bottom surface and a top surface of the first layer 1030. FIG. 11B additionally illustrates the second conductive layer 1034 formed over the first dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed over the second dielectric layer 1036. The third conductive layer 1038 may include portions of the signal path 1006 and the first inductor 1012. FIG. 11D illustrates the fourth conductive layer 1042 formed over the fourth dielectric layer 1040. The fourth conductive layer 1042 may include the second inductor 1016, third inductor 1022, and fourth inductor 1024. The dielectric layers 1032, 1036, 1040 are transparent to show the relative relocations of the various patterned conductive layers 1030, 1034, 1038, 1042.

III. Method of Forming a High Frequency Filter

Figure 19:
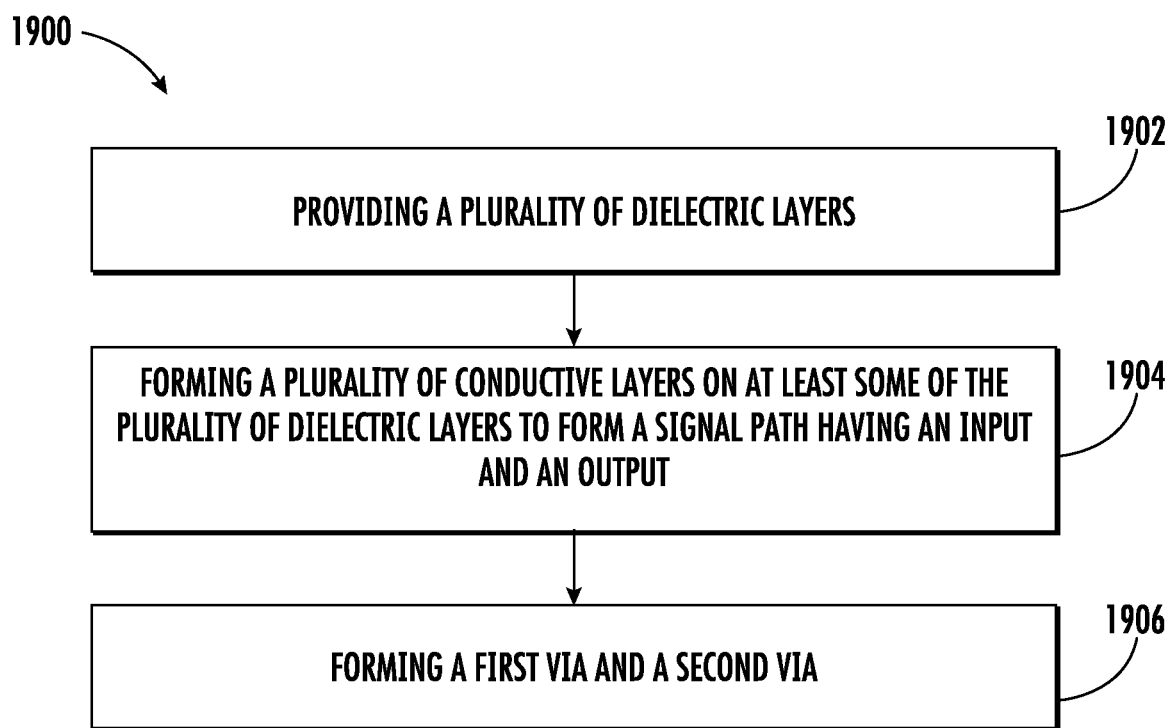
FIG. 19 is a flow diagram of a method of forming a high frequency multilayer filter according to aspects of the present disclosure.

Referring to FIG. 19, according to some aspects of the present disclosure, a method 1900 of forming a high frequency multilayer filter, for example as described above, may include, at (1902) providing a plurality of dielectric layers. For example, dielectric layers may be provided that correspond with the first, second and third dielectric layers described above with reference to FIGS. 3A through 11D.

At (1904), the method 1900 may include forming a plurality of conductive layers on at least some of the plurality of dielectric layers to form a signal path having an input and an output. For example, the method 1900 may include forming an inductor including a conductive layer on a first dielectric layer and a capacitor comprising a first electrode and a second electrode that is separated from the first electrode by a second dielectric layer, which is different than the first dielectric layer.

At (1906), the method 1900 may include forming a first via at a first location electrically connecting the inductor with a signal path and forming a second via at a second location electrically connecting the inductor with at least one of the signal path or a ground plane. The multilayer filter may have a characteristic frequency that is greater than about 8 GHz.

The first or second dielectric layers may include one or more thin layer of conductive material (e.g., a metal film) that is laminated or otherwise adhered to the second dielectric layer (e.g., on a top surface and/or on a bottom surface). The second dielectric layer may be obtained with the thin layer of conductive material already adhered, or, alternatively, forming the plurality of conductive layers. In some embodiments, the method 1900 may include adhering the thin layer of conductive material to the surface(s) of the second dielectric layer. The thin layer of conductive material may be selectively etched using a mask and photolithography to produce a desired pattern of the conductive material on the surface of the dielectric material. Alternatively, conductive layers may be formed over one or more of the dielectric layers using a suitable deposition technique.

In some embodiments, the various dielectric layers may be stacked and sequentially adhered or laminated to each other. For example, the third dielectric layer may be adhered to a top surface of the second dielectric layer after conductive layers are formed on a top surface of the second dielectric layer. The first dielectric layer may then be adhered to the second dielectric layer after conductive layers are formed on a bottom surface of second dielectric. Vias may be formed in the various dielectric layers during this process as needed.

IV. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

EXAMPLES

Computer modeling was used to simulate multilayer high frequency filters according to aspects of the present disclosure. Additionally, filters were built and tested. It should be understood that the following dimensions are merely given as examples and do not limit the scope of the present disclosure.

Various multilayer filters (including the multilayer filters 300, 600, 800, 1000 described above) may be configured to have the following pass band frequency ranges and the following respective effective inductor lengths ("L") and widths ("W"), in microns:

TABLE 1

Example Inductor Dimensions

| Embodiment | Approximate Pass Band (GHz) | First Inductor L | W | Second Inductor L | W | Third Inductor L | W | Fourth Inductor L | W |
|---|---|---|---|---|---|---|---|---|---|
| — | 12-15 | 406 | 102 | 2133 | 51 | 610 | 51 | 2692 | 51 |
| — | 14-17 | 457 | 102 | 2235 | 51 | 508 | 51 | 2590 | 51 |
| Filter 300 | 17-20 | 406 | 203 | 1575 | 51 | 610 | 102 | 1422 | 51 |
| Filter 600 | 24.5-28 | 305 | 203 | 914 | 51 | 152 | 51 | 864 | 51 |
| Filter 800 | 34.5-37.5 | 305 | 508 | 508 | 51 | 152 | 203 | 610 | 51 |
| Filter 1000 | 43-46.5 | 51 | 508 | 152 | 51 | 102 | 305 | 406 | 102 |

The third inductor 356 of the filter 300 may include the line width edition 364 as described above with reference to FIG. 5C. At the line width edition 364, the width 530 of the third inductor 356 may be about 152 microns.

Various multilayer filters (including the multilayer filters 300, 600, 800, 1000 described above) may be configured to have the following pass band frequency ranges and the following respective capacitive areas, in square millimeters ($mm^2$):

| Embodiment | Approximate Pass Band (GHz) | First Capacitor | Second Capacitor | Third Capacitor | Fourth Capacitor |
|---|---|---|---|---|---|
| — | 12-15 | 0.253 | 0.085 | 0.036 | 0.077 |
| — | 16-18 | 0.173 | 0.059 | 0.028 | 0.065 |
| Filter 300 | 17-21 | 0.153 | 0.058 | 0.028 | 0.063 |
| Filter 600 | 24.5-28 | 0.083 | 0.038 | 0.020 | 0.038 |
| Filter 800 | 34.5-37.5 | 0.065 | 0.015 | 0.013 | 0.018 |
| Filter 1000 | 43-46.5 | 0.044 | 0.013 | 0.010 | 0.010 |

The thicknesses of the dielectric layers may generally be less than about 180 micrometers ("microns"). For instance, in some embodiments, the second layers 304, 632, 832, 1032 may be about 60 microns thick. The third layers 304, 636, 836, 1036 may be about 20 microns thick. The fourth layers 308, 640, 840, 1040 may be about 60 microns thick.

In some embodiments, the overall length of the filters may be 4.3 mm. The overall width may be about 4 mm. The overall thickness may be about 230 microns.

Figure 12:
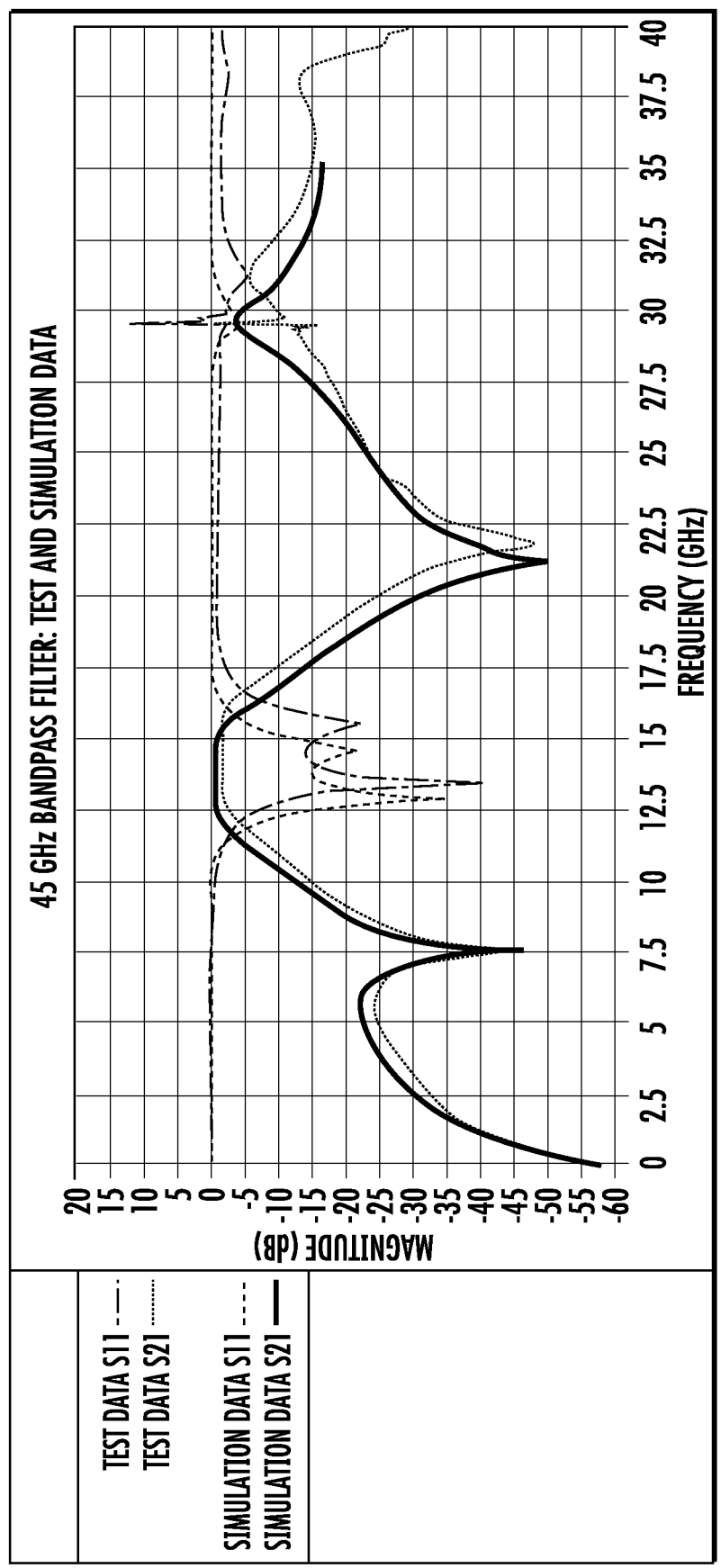
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
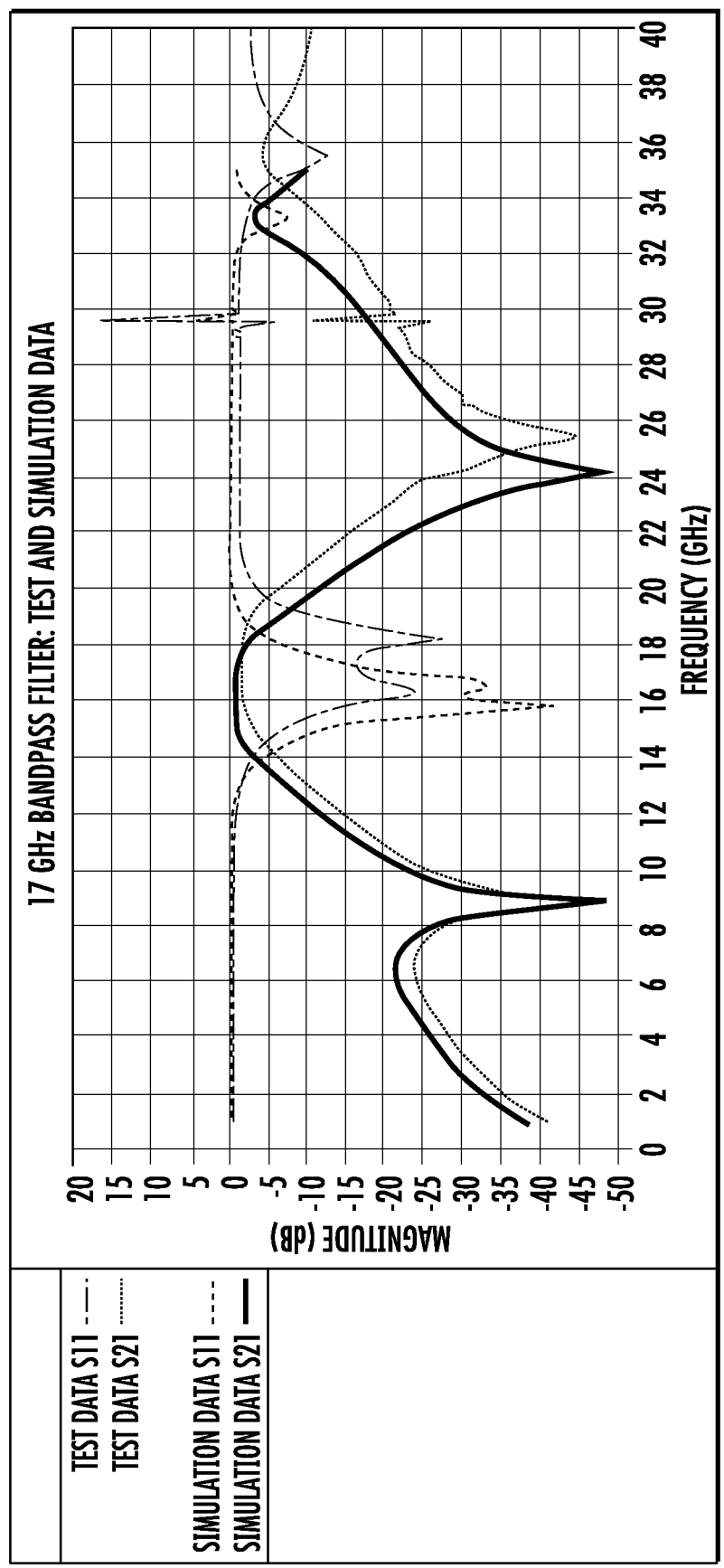
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
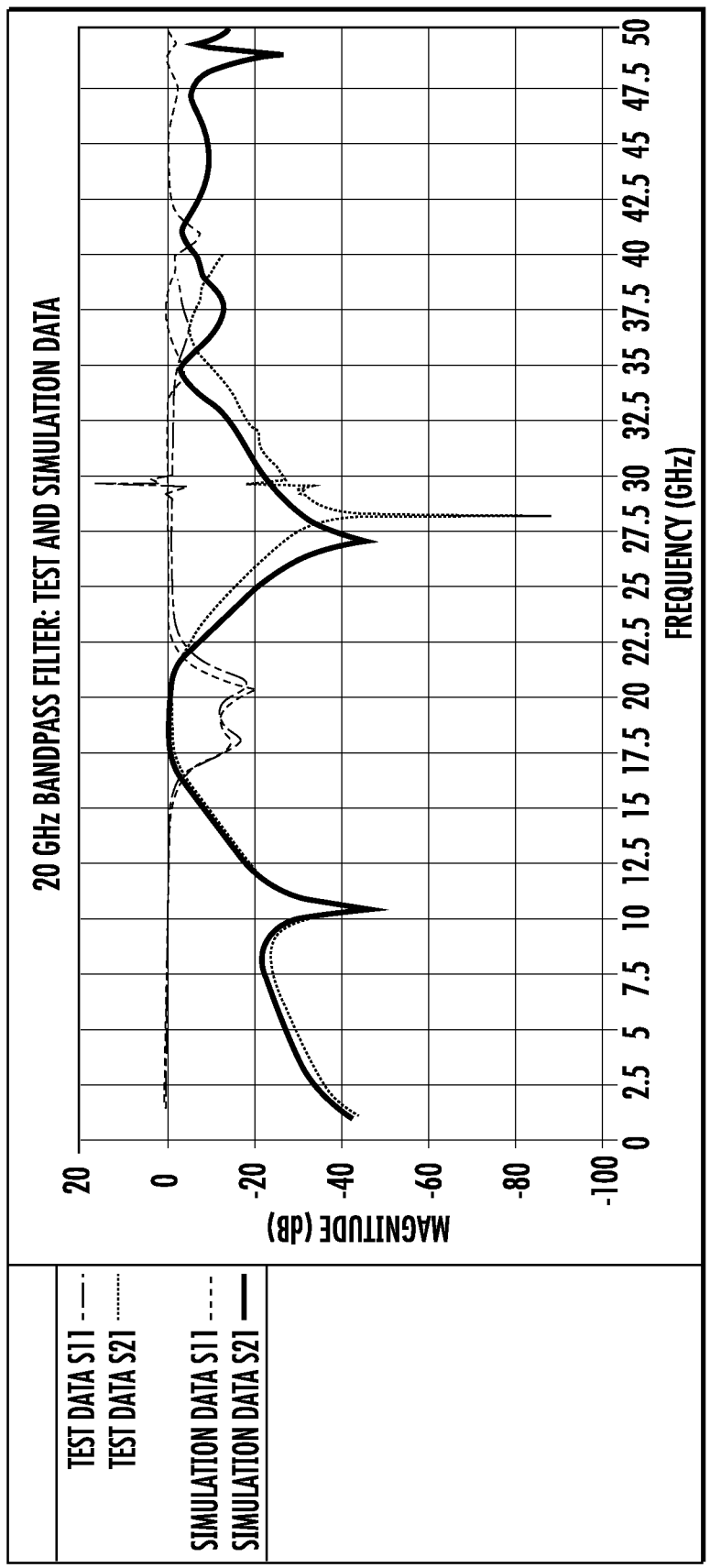
FIG. 14 is a plot of test data including measured insertion loss and return loss values for a filter constructed according to aspects of the present disclosure.

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Figure 15:
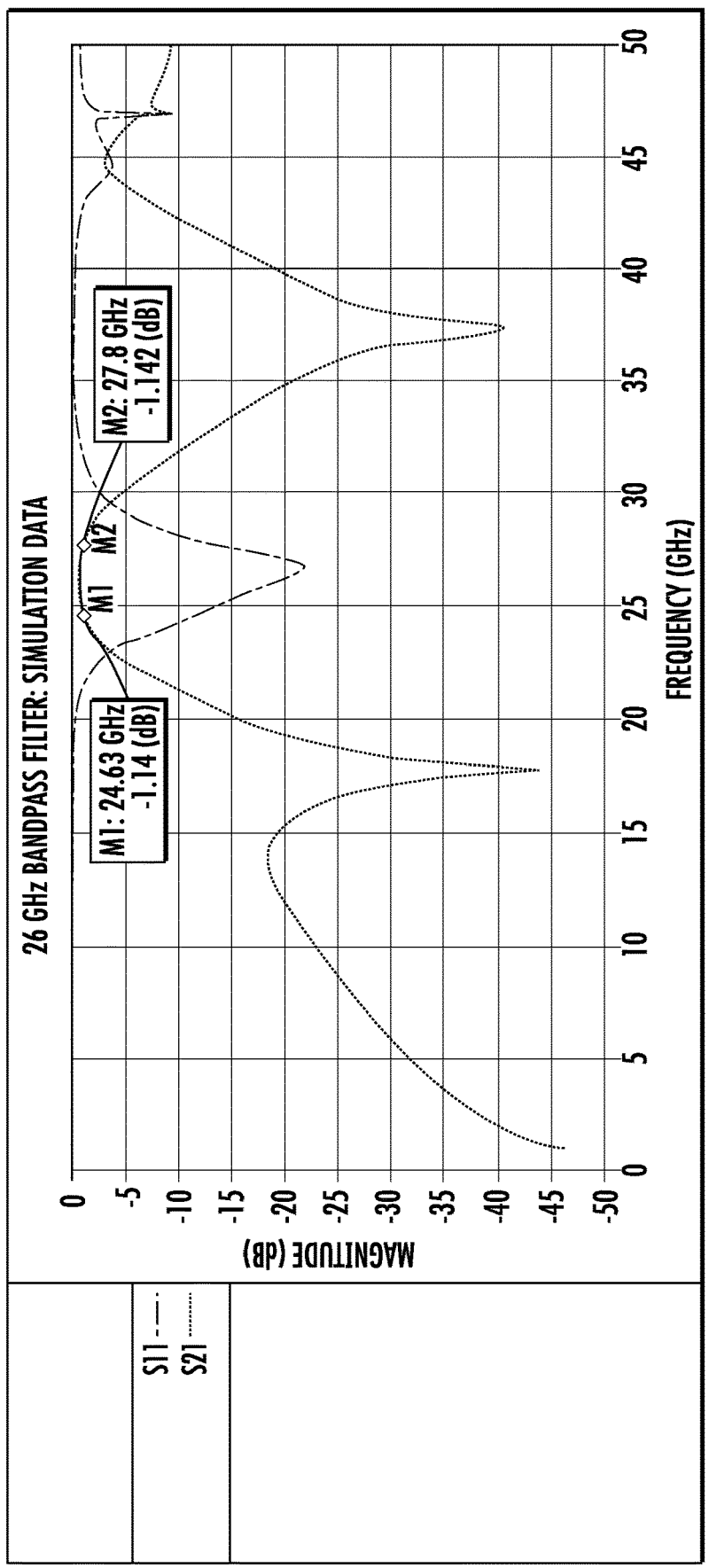
FIG. 15 is a plot of simulation data including insertion loss and return loss values from a computer analysis of a filter according to aspects of the present disclosure.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16:
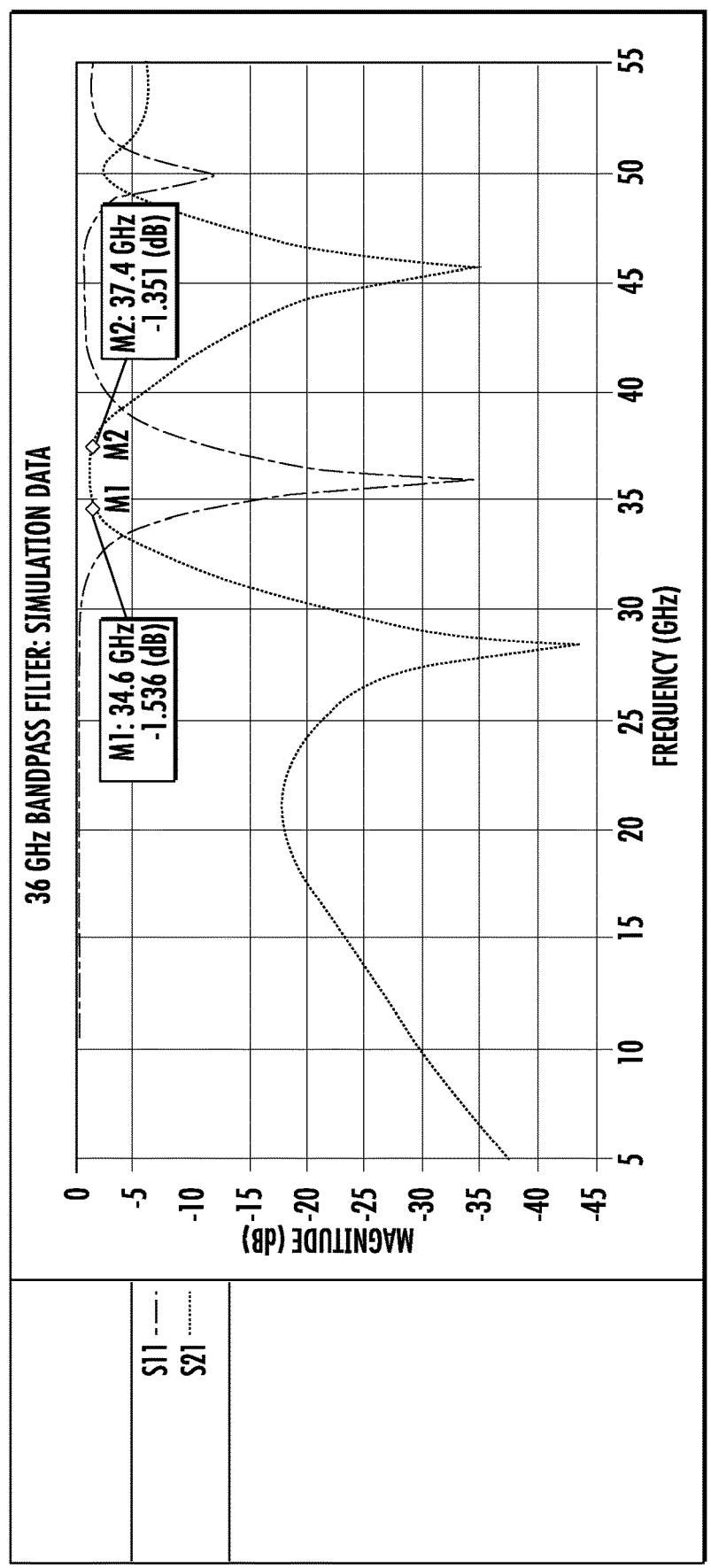
FIG. 16 is a plot of simulation data including insertion loss and return loss values from a computer analysis of a filter according to aspects of the present disclosure.

Referring to FIG. 16, the multilayer filter 800 described above with reference to FIGS. 8A through 9D was simulated. Simulated insertion loss ($S_{21}$) values and simulated return loss ($S_{11}$) values are plotted from 0 GHz to 55 GHz. The pass band is from about 34.6 GHz to about 37.4 GHz.

Figure 17:
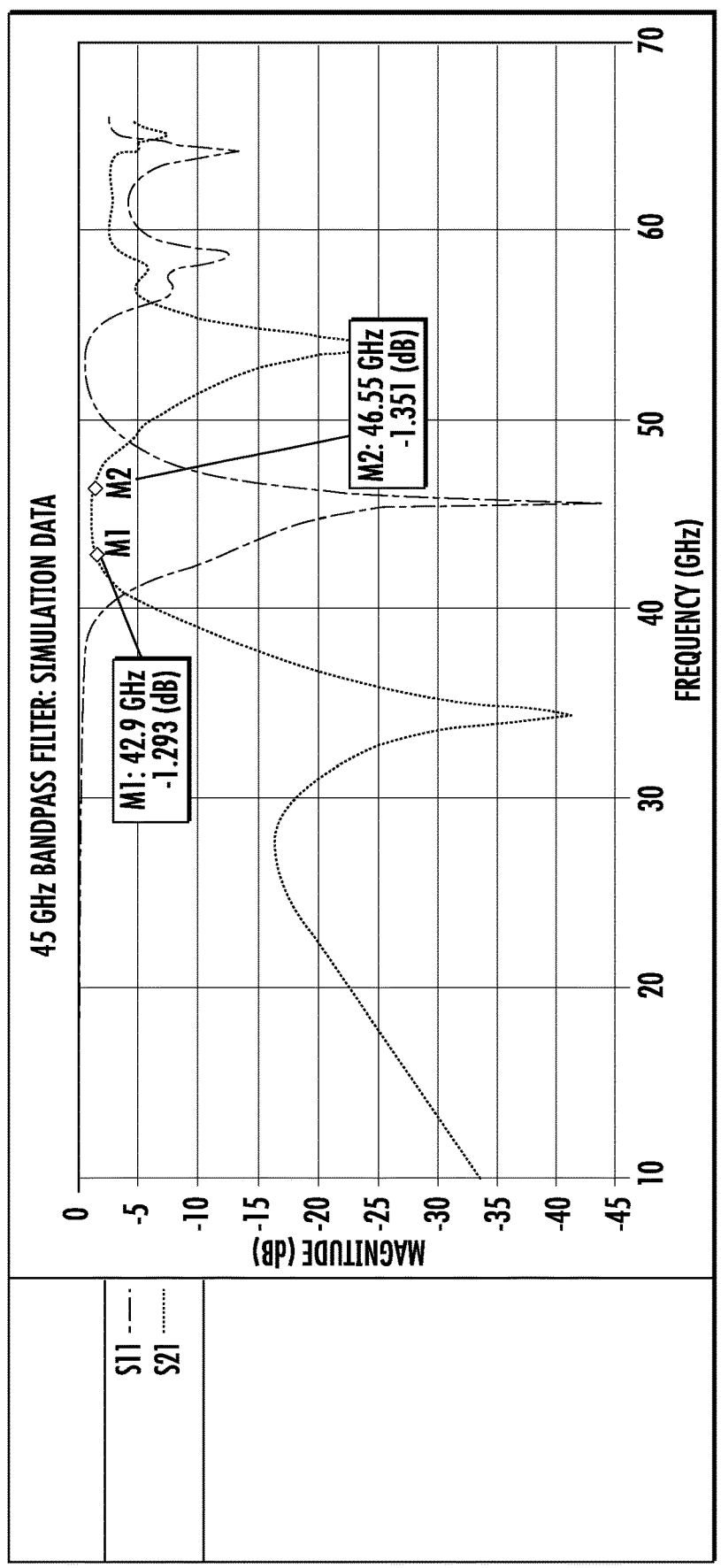
FIG. 17 is a plot of simulation data including insertion loss and return loss values from a computer analysis of a filter according to aspects of the present disclosure.

Referring to FIG. 17, the multilayer filter 1000 described above with reference to FIGS. 10A through 11D was simulated. Simulated insertion loss ($S_{21}$) values and simulated return loss ($S_{11}$) values are plotted from 0 GHz to 70 GHz. The pass band is from about 42.9 GHz to about 46.6 GHz.

TEST METHODS

Figure 18:
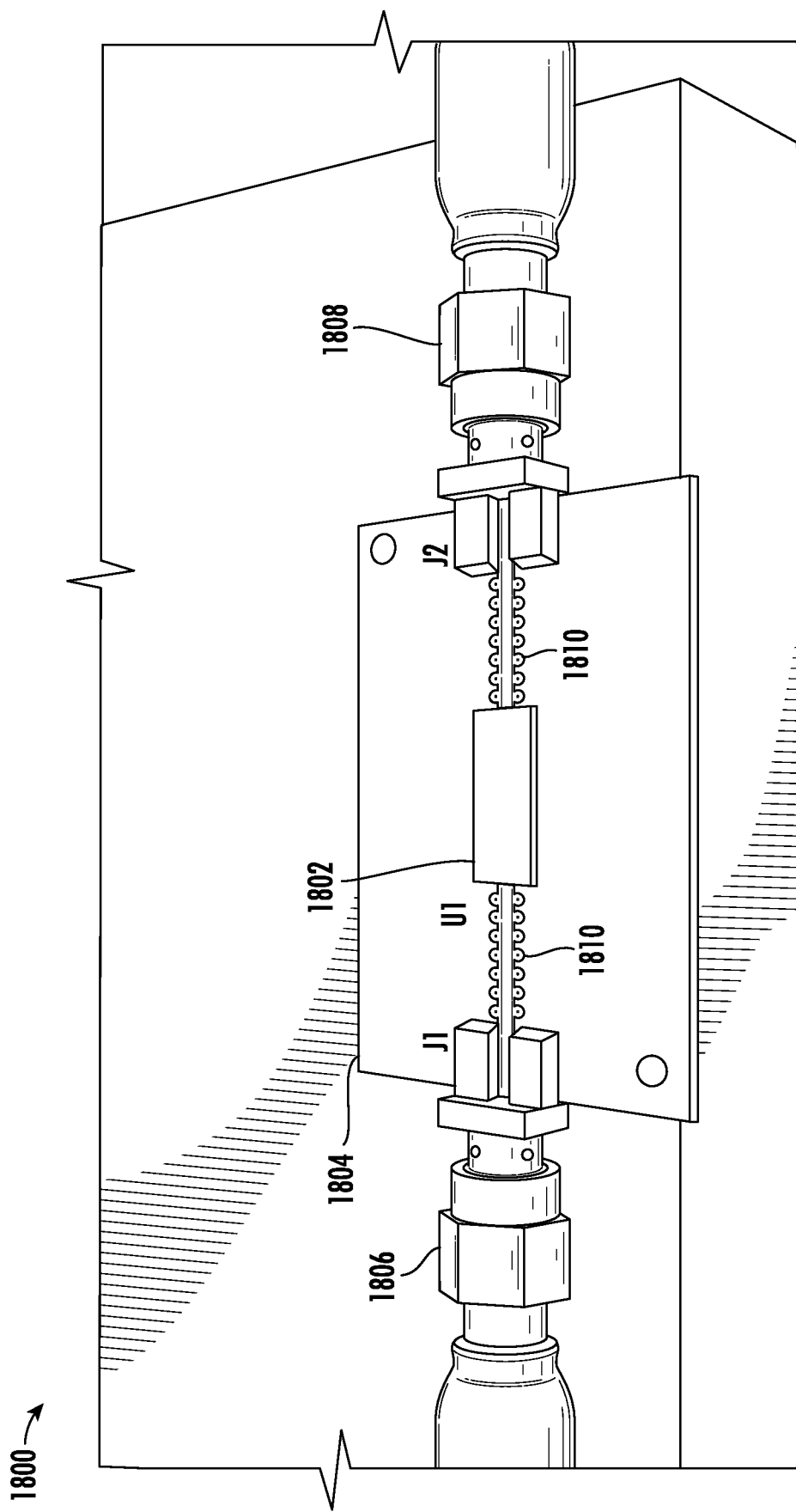
FIG. 18 is a perspective view of a testing assembly including a filter according to aspects of the present disclosure.

Referring to FIG. 18, a testing assembly 1800 can be used to test performance characteristics, such as insertion loss and return loss, of a high frequency multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., a 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A high frequency multilayer filter comprising:
   a plurality of dielectric layers;
   a signal path having an input and an output;
   an inductor comprising a conductive layer formed over a first dielectric layer;
   a first via at a first location electrically connecting the conductive layer with the signal path;
   a second via at a second location electrically connecting the conductive layer with at least one of the signal path or a ground; and
   a capacitor comprising a first electrode and a second electrode that is separated from the first electrode by a second dielectric layer;
   wherein the multilayer filter has a characteristic frequency that is greater than about 8 GHz, and
   wherein the conductive layer of the inductor has an effective length between the first location and the second location that is less than about 5 mm.

2. The high frequency multilayer filter as in claim 1, wherein the characteristic frequency comprises at least one of a low pass frequency, a high pass frequency, or an upper bound of a bandpass frequency.

3. The high frequency multilayer filter as in claim 1, wherein the conductive layer of the inductor is parallel with an X-Y plane and spaced apart from each of the first electrode and second electrode of the capacitor in a Z-direction that is perpendicular with the X-Y plane by at least 10 microns.

4. The high frequency multilayer filter as in claim 1, wherein the inductor comprises a first elongated section elongated in a first direction and having a first width and a second elongated section elongated in a second direction and having a second width, and wherein the first direction is greater than about 15 degrees from the second direction.

5. The high frequency multilayer filter as in claim 4, wherein the first width of the first elongated section is approximately equal to the second width of the second elongated section.

6. The high frequency multilayer filter as in claim 1, wherein the inductor comprises at least two corners.

7. The high frequency multilayer filter as in claim 1, wherein the inductor defines less than one half of a loop.

8. The high frequency multilayer filter as in claim 1, wherein the inductor defines at least one half of a loop.

9. The high frequency multilayer filter as in claim 1, further comprising an additional capacitor having a capacitive area that is less than about 0.05 mm$^2$.

10. The high frequency multilayer filter as in claim 1, wherein the conductive layer of the inductor has a width that is less than 1 mm.

11. The high frequency multilayer filter as in claim 1, wherein the dielectric layer on which the conductive layer of the inductor is formed has a thickness that is less than about 100 microns.

12. The high frequency multilayer filter as in claim 1, wherein the second via is formed in the dielectric layer on which the conductive layer of the inductor is formed, the second via being electrically connected to the inductor and the ground.

13. The high frequency multilayer filter as in claim 12, further comprising:
    an additional conductive layer formed over another of the plurality of dielectric layers; and
    an additional via formed in the dielectric layer on which the conductive layer of the inductor is formed, the additional via being electrically connected to the inductor and the additional conductive layer.

14. The high frequency multilayer filter as in claim 1, further comprising a self-aligning capacitor, and wherein the ground comprises a ground plane, and wherein the self-aligning capacitor is electrically connected to the ground plane and capacitively coupled with the signal path.

15. The high frequency multilayer filter as in claim 1, further comprising a dielectric material that comprises a ceramic-filled epoxy.

16. The high frequency multilayer filter as in claim 1, further comprising an organic dielectric material.

17. A high frequency multilayer filter comprising:
a plurality of dielectric layers;
a signal path having an input and an output;
an inductor comprising a conductive layer formed over a first dielectric layer, and wherein the inductor is electrically connected at a first location with the signal path and electrically connected at a second location with at least one of the signal path or a ground; and
a capacitor comprising a first electrode and a second electrode that is separated from the first electrode by a second dielectric layer;
wherein the multilayer filter has a characteristic frequency that is greater than about 8 GHz,
wherein the inductor comprises a first elongated section elongated in a first direction and having a first width and a second elongated section elongated in a second direction and having a second width,
wherein the first direction is greater than about 15 degrees from the second direction, and
wherein the first width of the first elongated section is approximately equal to the second width of the second elongated section.

18. A high frequency multilayer filter comprising:
a plurality of dielectric layers;
a signal path having an input and an output;
an inductor comprising a conductive layer formed over a first dielectric layer, and wherein the inductor is electrically connected at a first location with the signal path and electrically connected at a second location with at least one of the signal path or a ground; and
a capacitor comprising a first electrode and a second electrode that is separated from the first electrode by a second dielectric layer;
wherein the multilayer filter has a characteristic frequency that is greater than about 8 GHz,
wherein the multilayer filter comprises a dielectric material disposed between the first electrode and the second electrode, the dielectric material having a dielectric constant that ranges from about 5 to about 8 in accordance with IPC TM-650 2.5.5.3 at an operating temperature of 25° C. and frequency of 1 MHz, and
wherein the multilayer filter further comprises an additional dielectric material having a dielectric constant that ranges from about 1 to about 4 in accordance with IPC TM-650 2.5.5.3 at an operating temperature of 25° C. and frequency of 1 MHz.

* * * * *